(12) United States Patent
Jia et al.

(10) Patent No.: US 12,284,903 B2
(45) Date of Patent: Apr. 22, 2025

(54) DISPLAY SUBSTRATE AND PREPARATION METHOD THEREOF, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Li Jia, Beijing (CN); Tao Gao, Beijing (CN); Yucheng Chan, Beijing (CN); Pinfan Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/795,547

(22) PCT Filed: Sep. 27, 2021

(86) PCT No.: PCT/CN2021/121040
§ 371 (c)(1),
(2) Date: Jul. 27, 2022

(87) PCT Pub. No.: WO2023/044914
PCT Pub. Date: Mar. 30, 2023

(65) Prior Publication Data
US 2024/0188411 A1    Jun. 6, 2024

(51) Int. Cl.
*H10K 77/10*    (2023.01)
*H10K 59/80*    (2023.01)
*H10K 71/13*    (2023.01)

(52) U.S. Cl.
CPC ......... *H10K 77/111* (2023.02); *H10K 59/873* (2023.02); *H10K 71/135* (2023.02)

(58) Field of Classification Search
CPC .. H10K 77/111; H10K 59/873; H10K 71/135; H10K 59/12; H10K 50/80; Y02E 10/549
See application file for complete search history.

(56) References Cited

U.S. PATENT DOCUMENTS

2019/0334120 A1    10/2019    Seo et al.
2019/0363142 A1 *  11/2019    Tanaka .................... H10K 71/80
(Continued)

FOREIGN PATENT DOCUMENTS

CN    109671719 A    4/2019
CN    111341210 A    6/2020
(Continued)

*Primary Examiner* — J. E. Schoenholtz
(74) *Attorney, Agent, or Firm* — Ling Wu; Stephen Yang; Ling and Yang Intellectual Property

(57) ABSTRACT

Provided is a display substrate including a flexible base substrate, a first filling layer, and an encapsulation layer. The flexible base substrate includes at least one stretch display region. The stretch display region includes multiple pixel island regions spaced apart from each other, multiple hole regions, and a connection bridge region located between a pixel island region and a hole region. At least one hole region is provided with one or more first through holes penetrating the flexible base substrate. The first filling layer is located in the hole region and is filled in a first through hole. The encapsulation layer is located on a side of the first filling layer away from the flexible base substrate, and an orthographic projection of the encapsulation layer on the flexible base substrate is partially overlapped with or is not overlapped with the first filling layer.

20 Claims, 12 Drawing Sheets

(56) References Cited

U.S. PATENT DOCUMENTS

| | | | |
|---|---|---|---|
| 2021/0191552 A1 | 6/2021 | Bok et al. | |
| 2021/0376269 A1* | 12/2021 | Hong | H10K 59/124 |
| 2022/0140279 A1 | 5/2022 | Cao et al. | |
| 2022/0149122 A1 | 5/2022 | Lu et al. | |
| 2022/0199704 A1 | 6/2022 | Wang et al. | |

FOREIGN PATENT DOCUMENTS

| | | | |
|---|---|---|---|
| CN | 111564482 A | 8/2020 | |
| CN | 111653595 A | 9/2020 | |
| CN | 111755627 A | 10/2020 | |
| CN | 112186023 A | 1/2021 | |
| CN | 112331077 A | 2/2021 | |
| CN | 112366208 A | 2/2021 | |
| CN | 112635688 A | 4/2021 | |
| CN | 113035910 A | 6/2021 | |

* cited by examiner

DISPLAY SUBSTRATE AND PREPARATION METHOD THEREOF, AND DISPLAY APPARATUS

CROSS-REFERENCE TO RELATED APPLICATION

The present application is a U.S. National Phase Entry of International Application No. PCT/CN2021/121040 having an international filing date of Sep. 27, 2021. The entire contents of the above-identified application are hereby incorporated by reference.

TECHNICAL FIELD

Embodiments of the present disclosure relate to, but are not limited to, the field of display technologies, in particular to a display substrate and a preparation method thereof, and a display apparatus.

BACKGROUND

An Organic Light Emitting Diode (OLED) is an active light emitting display device, which has advantages of self-illumination, ultra-thinness, a fast response speed, a wide viewing angle, and low power consumption. With continuous development of OLED display technologies, display products using the OLED display technologies have gradually developed from a current curved product form to a foldable or even stretchable product form.

SUMMARY

The following is a summary of subject matters described herein in detail. The summary is not intended to limit the protection scope of claims.

The embodiments of the present disclosure provide a display substrate and a preparation method thereof, and a display apparatus.

In one aspect, an embodiment of the present disclosure provides a display substrate including a flexible base substrate, a first filling layer, and an encapsulation layer. The flexible base substrate includes at least one stretch display region. The stretch display region includes multiple pixel island regions spaced apart from each other, multiple hole regions, and a connection bridge region located between a pixel island region and a hole region. At least one hole region is provided with one or more first through holes penetrating the flexible base substrate. The first filling layer is located in the hole region and filled in a first through hole. The encapsulation layer is located on a side of the first filling layer away from the flexible base substrate. An orthographic projection of the encapsulation layer on the flexible base substrate is partially overlapped with or is not overlapped with the first filling layer.

In some exemplary implementation modes, the display substrate further includes a first planarization layer located in the pixel island region and the connection bridge region, and the first planarization layer and the first filling layer have a same layer structure and a same material.

In some exemplary implementation modes, the hole region further includes a composite insulation layer stacked on the flexible base substrate, the composite insulation layer has a second through hole; the second through hole penetrates the composite insulation layer and penetrates through a corresponding first through hole. The composite insulation layer includes at least one inorganic layer, or includes at least one organic layer, or includes at least one inorganic layer and at least one organic layer.

In some exemplary implementation modes, the display substrate further includes a second filling layer located in the hole region, wherein the second filling layer is filled in the second through hole. The second filling layer is in contact with the first filling layer, and an orthographic projection of the second filling layer on the flexible base substrate is at least partially overlapped with an orthographic projection of the first filling layer on the flexible base substrate. The orthographic projection of the encapsulation layer on the flexible base substrate is partially overlapped with or is not overlapped with the orthographic projection of the second filling layer on the flexible base substrate.

In some exemplary implementation modes, the display substrate further includes a second planarization layer located in the pixel island region and the connection bridge region, wherein the second planarization layer is located on a side of the first planarization layer away from the flexible base substrate, and the second planarization layer and the second filling layer have a same layer structure and a same material.

In some exemplary implementation modes, a surface of the second filling layer away from the flexible base substrate is flush with a surface of the composite insulation layer away from the flexible base substrate.

In some exemplary implementation modes, in a direction perpendicular to the display substrate, a cross-sectional shape of the second through hole is an inverted trapezoid.

In some exemplary implementation modes, a surface of the first filling layer is flush with a surface of the flexible base substrate.

In some exemplary implementation modes, the at least one hole region is provided with a second isolation groove formed on the flexible base substrate and the first filling layer, and the second isolation groove penetrates through the second through hole of the composite insulation layer. At least one insulation layer in the composite insulation layer has a second protruding part, and an orthographic projection of the second protruding part on the flexible base substrate is located in an orthographic projection of the second isolation groove on the flexible base substrate. The orthographic projection of the second isolation groove on the flexible base substrate covers an orthographic projection of the first filling layer on the flexible base substrate.

In some exemplary implementation modes, a depth of the second isolation groove is about 1.5 microns to 2.0 microns.

In some exemplary implementation modes, in a direction perpendicular to the display substrate, a distance between a sidewall of the second protruding part of the at least one insulation layer of the composite insulation layer and a sidewall of the second isolation groove on a same side is about 0.3 microns to 0.5 microns.

In some exemplary implementation modes, the display substrate further includes a second planarization layer located on a side of the first planarization layer away from the flexible base substrate, and a passivation layer located on a side of the second planarization layer away from the flexible base substrate. The connection bridge region is provided with a first isolation groove formed by penetrating the passivation layer and a part of the second planarization layer. The passivation layer has a first protruding part, and an orthographic projection of the first protruding part on the flexible base substrate is located in an orthographic projection of the first isolation groove on the flexible base substrate.

In some exemplary implementation modes, the encapsulation layer includes a first inorganic encapsulation layer, an organic encapsulation layer, and a second inorganic encapsulation layer that are stacked.

In another aspect, an embodiment of the present disclosure provides a display apparatus, which includes the display substrate as described above.

In another aspect, an embodiment of the present disclosure provides a preparation method of a display substrate. The display substrate includes at least one stretch display region, the stretch display region includes multiple pixel island regions spaced apart from each other, multiple hole regions, and a connection bridge region located between a pixel island region and a hole region. The preparation method includes: forming one or more first through holes penetrating a flexible base substrate in the hole region; forming a first filling layer for filling a first through hole in the hole region; and forming an encapsulation layer, wherein an orthographic projection of the encapsulation layer on the flexible base substrate is partially overlapped with or is not overlapped with the first filling layer.

In some exemplary implementation modes, the above preparation method further includes: forming a first planarization layer in the pixel island region and the connection bridge region while forming the first filling layer in the hole region.

In some exemplary implementation modes, the above preparation method further includes: forming a composite insulation layer on the flexible base substrate before the first filling layer is formed in the hole region, and forming a second through hole in the composite insulation layer of the hole region, wherein the second through hole penetrates the composite insulation layer and penetrates through a corresponding first through hole.

In some exemplary implementation modes, the above preparation method further includes: forming a second planarization layer in the pixel island region and the connection bridge region after the first filling layer is formed in the hole region, at the same time, forming a second filling layer in the hole region, wherein the second filling layer is filled in the second through hole. The second filling layer is in contact with the first filling layer, and an orthographic projection of the second filling layer on the flexible base substrate is at least partially overlapped with an orthographic projection of the first filling layer on the flexible base substrate. The orthographic projection of the encapsulation layer on the flexible base substrate is partially overlapped with or is not overlapped with the orthographic projection of the second filling layer on the flexible base substrate.

In some exemplary implementation modes, the above preparation method further includes: after the first filling layer is formed in the hole region, forming a second isolation groove penetrating the composite insulation layer, a part of the second planarization part, and a part of the flexible base substrate, in the hole region. The second isolation groove penetrates through the second through hole of the composite insulation layer; at least one insulation layer in the composite insulation layer has a second protruding part, and an orthographic projection of the second protruding part on the flexible base substrate is located in an orthographic projection of the second isolation groove on the flexible base substrate. The orthographic projection of the second isolation groove on the flexible base substrate covers an orthographic projection of the first filling layer on the flexible base substrate.

In another aspect, an embodiment of the present disclosure further provides a display substrate including a flexible base substrate. The flexible base substrate includes at least one stretch display region, the stretch display region includes multiple pixel island regions spaced apart from each other, multiple hole regions, and a connection bridge region located between a pixel island region and a hole region; at least one hole region is provided with one or more first through holes penetrating the flexible base substrate. The hole region further includes a composite insulation layer stacked on the flexible base substrate; the composite insulation layer has a second through hole; the second through hole penetrates the composite insulation layer and penetrates through a corresponding first through hole. An orthographic projection of the composite insulation layer on the flexible base substrate is overlapped with an orthographic projection of a first through hole on the flexible base substrate.

In some exemplary implementation modes, the composite insulation layer includes a first insulation layer in contact with the flexible base substrate, and the second through hole includes a first via provided in the first insulation layer; an orthographic projection of the first via on the flexible base substrate is located in the orthographic projection of the first through hole on the flexible base substrate.

In some exemplary implementation modes, the display substrate further includes an encapsulation layer located on a side of the composite insulation layer away from the flexible base substrate, and the encapsulation layer covers sidewalls of the first through hole and the second through hole in the hole region.

In some exemplary implementation modes, the first through hole includes a first sub-through hole and a second sub-through hole that communicate with each other, and the first sub-through hole penetrates through the second through hole. An orthographic projection of the first sub-through hole on the flexible base substrate is located in an orthographic projection of the second sub-through hole on the flexible base substrate.

In some exemplary implementation modes, the display substrate further includes an encapsulation layer located on a side of the composite insulation layer away from the flexible base substrate, and the encapsulation layer covers sidewalls of the first sub-through hole and the second through hole in the hole region.

In some exemplary implementation modes, in a direction perpendicular to the display substrate, a cross-sectional shape of the second sub-through hole is a trapezoid.

In some exemplary implementation modes, the encapsulation layer includes a first inorganic encapsulation layer and a second inorganic encapsulation layer that are stacked.

After reading and understanding drawings and detailed description, other aspects may be understood.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of one or more components in the drawings do not reflect true scales, and are only intended to schematically describe contents of the present disclosure.

DETAILED DESCRIPTION

Figure 1:
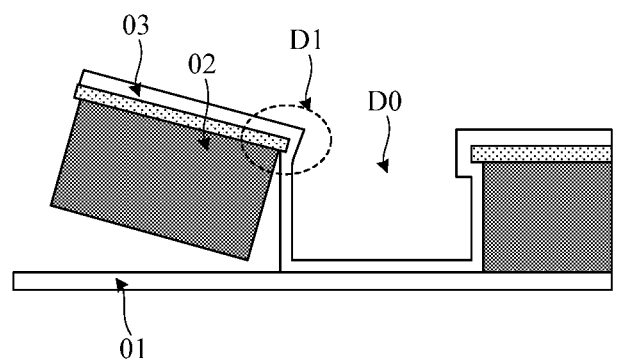
FIG. 1 is a schematic diagram showing peeling failure of a display substrate and a glass substrate.

The embodiments of the present disclosure will be described in detail below in combination with the drawings. Implementation modes may be implemented in multiple different forms. Those of ordinary skill in the art may easily understand such a fact that modes and contents may be transformed into other forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, one mode of the present disclosure is not necessarily limited to the size, and a shape and a size of one or more components in the drawings do not reflect true scale. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion of constituent elements, but are not intended to be limited in quantity. In the present disclosure, "multiple" represents two or more than two.

In the specification, for convenience, wordings indicating directional or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to a direction in which the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through middleware, or communication inside two elements. Those of ordinary skills in the art may understand meanings of the above-mentioned terms in the present disclosure according to situations.

In the specification, an "electrical connection" includes a case that constituent elements are connected together through an element having some electrical function. The "element having some electrical function" is not particularly limited as long as electrical signals between the connected constituent elements may be transmitted. Examples of the "element having some electrical function" not only include an electrode and a wiring, but also include a switch element such as a transistor, a resistor, an inductor, a capacitor, another element with multiple functions, etc.

In the specification, a transistor refers to an element which at least includes three terminals, i.e., a gate, a drain, and a source. The transistor has a channel region between the drain (drain electrode terminal, drain region, or drain electrode) and the source (source electrode terminal, source region, or source electrode), and a current can flow through the drain, the channel region, and the source. In the specification, the channel region refers to a region through which a current mainly flows.

In the specification, a first electrode may be a drain and a second electrode may be a source, or, a first electrode may be a source and a second electrode may be a drain. In a case that transistors with opposite polarities are used, or in a case that a direction of a current changes during work of a circuit, or the like, functions of the "source" and the "drain" may sometimes be exchanged. Therefore, the "source" and the "drain" may be exchanged in the specification.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the present disclosure, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to a case that a boundary is defined not so strictly and a process and measurement error within a range is allowed.

In the present disclosure, "stretchable" refers to an ability of a material, a structure, an apparatus, or an apparatus component to withstand tensile deformation (e.g., lengthening, or widening, or both lengthening and widening) without permanent deformation or failure such as rupture, for example, an ability to be stretched at least 10% of a length without permanent deformation, cracking, or breaking. "Stretchable" is also intended to include a substrate constructed with a following mode and having components (whether or not the components themselves may be individually stretched as described above): may accommodate a stretchable, expandable, or deployable surface and may still retain functionality when applied to a stretchable, expandable, or deployable surface that has been stretched, expanded, or deployed. "Stretchable" is also intended to include a substrate that may be elastically or plastically deformed (i.e., after being stretched, the substrate may be changed back to its original size when a tensile force is released, or the substrate may not be changed back to its original size and in some examples, may remain in a stretched form), and deformation (e.g. stretching and optionally bending) may occur during manufacture of the substrate, during assembly (which may be considered as a part of a manufacturing operation) of an apparatus having the substrate, or during use (e.g. a user is able to stretch and optionally bend the substrate).

In some implementation modes, a stretchable display substrate is usually designed with a large number of openings. However, in a preparation process of the stretchable display substrate, after an opening structure is formed on a flexible base substrate, due to a relatively large segment difference (for example, greater than 10 microns), it is easy to lead to deep hole exposure residues in a subsequent process, thus affecting tensile properties of the display substrate. Moreover, when the display substrate is peeled off from a glass substrate, an encapsulation layer is prone to tearing failure, thereby causing encapsulation failure of the stretchable display substrate.

FIG. 1 is a schematic diagram showing peeling failure of a display substrate and a glass substrate. As shown in FIG. 1, an opening region D0 of a flexible base substrate 02 is covered with an encapsulation layer 03. In the opening region D0, the encapsulation layer 03 is in direct contact with a sidewall of the flexible base substrate 02 and the glass substrate 01. When the flexible base substrate 02 is peeled off from the glass substrate 01, the encapsulation layer 03 in direct contact with the glass substrate 01 in the opening region D0 is not easily separated from the glass substrate 01, which easily leads to a tear breakage point of the encapsulation layer 03 at a first position D1 during a peeling process, thus causing encapsulation failure of the display substrate.

At least one embodiment of the present disclosure provides a display substrate, which includes a flexible base substrate, a first filling layer, and an encapsulation layer. The flexible base substrate includes at least one stretch display region. The stretch display region includes multiple pixel island regions spaced apart from each other, multiple hole regions, and a connection bridge region located between a pixel island region and a hole region. At least one hole region is provided with one or more first through holes penetrating the flexible base substrate. The first filling layer is located in a hole region and filled in the first through holes. The encapsulation layer is located on a side of the first filling layer away from the flexible base substrate, and an orthographic projection of the encapsulation layer on the flexible base substrate is partially overlapped with or is not overlapped with the first filling layer.

According to the display substrate provided by the embodiment of the present disclosure, by filling the first filling layer in the first through holes penetrating the flexible base substrate, residues generated in a deep hole exposure process may be avoided, tensile properties of the display substrate may be improved, and cracking failure of the encapsulation layer may be avoided when the display substrate is peeled off from the glass substrate, thereby improving reliability of encapsulation of the display substrate.

In some exemplary implementation modes, adhesion of the first filling layer may be different from adhesion of the flexible base substrate. By filling the first through holes of the flexible base substrate with the first filling layer having different adhesion, a stretchable effect of the display substrate may be ensured.

In some exemplary implementation modes, the display substrate may further include a first planarization layer located in the pixel island region and the connection bridge region. The first planarization layer and the first filling layer have a same layer structure and a same material. In this example, the first planarization layer and the first filling layer may be prepared simultaneously to simplify a preparation process.

In some exemplary implementation modes, a surface of the first filling layer may be flush with a surface of the flexible base substrate. In this example, by arranging the surface of the first filling layer and the surface of the flexible base substrate to be flush, a film layer formed on the flexible base substrate subsequently may be smoothed and is not easy to be broken. However, this embodiment is not limited thereto. In some exemplary implementation modes, the surface of the first filling layer may not be flush with the surface of the flexible base substrate, e.g. the surface of the first filling layer is higher than the surface of the flexible base substrate, or the surface of the first filling layer is lower than the surface of the flexible base substrate.

In some exemplary implementation modes, the hole region further includes a composite insulation layer stacked on the flexible base substrate. The composite insulation layer has a second through hole. The second through hole penetrates the composite insulation layer and penetrates through a corresponding first through hole. The composite insulation layer may include at least one inorganic layer, or include at least one organic layer, or include at least one inorganic layer and at least one organic layer. In some examples, the composite insulation layer includes only an inorganic layer, i.e. an inorganic composite insulation layer; or, the composite insulation layer may include only an organic layer, that is, an organic composite insulation layer; or, the composite insulation layer may include an inorganic layer and an organic layer. In this example, a stretchable effect of the display substrate may be improved by digging out the composite insulation layer in the hole region. However, this embodiment is not limited thereto.

In some exemplary implementation modes, the display substrate may further include a second filling layer located in the hole region, and the second filling layer is filled in the second through hole. The second filling layer is in contact with the first filling layer, and an orthographic projection of the second filling layer on the flexible base substrate is at least partially overlapped with an orthographic projection of the first filling layer on the flexible base substrate, An orthographic projection of the encapsulation layer on the flexible base substrate is partially overlapped with or is not overlapped with an orthographic projection of the second filling layer on the flexible base substrate. In this example, the second filling layer is not covered or is not completely covered by the encapsulation layer, so that a stretching effect of the display substrate may be ensured. By filling the second filling layer in the second through hole, residues generated in the deep hole exposure process may be avoided, and the stretchable effect of the display substrate may be improved. Moreover, cracking failure of the encapsulation layer may be avoided when the display substrate is peeled off from the glass substrate, thereby improving reliability of encapsulation of the display substrate.

In some examples, the composite insulation layer may include an organic layer, and the second filling layer and the organic layer of the composite insulation layer may have a same layer structure and a same material. However, this embodiment is not limited thereto.

In some exemplary implementation modes, the display substrate may further include a second planarization layer located in the pixel island region and the connection bridge region. The second planarization layer is located on a side of the first planarization layer away from the flexible base substrate, the second planarization layer and the second filling layer having a same layer structure and a same material. In this example, the second planarization layer and the second filling layer may be prepared simultaneously to simplify a preparation process.

In some exemplary implementation modes, a surface of the second filling layer away from the flexible base substrate may be flush with a surface of the composite insulation layer away from the flexible base substrate. By arranging the surface of the second filling layer and the surface of the composite insulation layer to be flush, a film layer formed on the composite insulation layer subsequently may be smoothed and is not easy to be broken. However, this embodiment is not limited thereto. For example, the surface of the second filling layer away from the flexible base substrate may be lower than the surface of the composite insulation layer away from the flexible base substrate.

In some exemplary implementation modes, at least one hole region may be provided with a second isolation groove formed on the flexible base substrate and the first filling layer. The second isolation groove penetrates through the second through hole of the composite insulation layer. At least one insulation layer in the composite insulation layer has a second protruding part, and an orthographic projection of the second protruding part on the flexible base substrate is located in an orthographic projection of the second isolation groove on the flexible base substrate. In this example, a part of the second isolation groove is formed on the first filling layer, and a remaining part may be formed on the flexible base substrate. The second protruding part of the at least one insulation layer of the composite insulation layer is located at a notch of the second isolation groove so that an orthographic projection of the notch of the second isolation groove is located in the orthographic projection of the second isolation groove on the flexible base substrate. The orthographic projection of the second isolation groove on the flexible base substrate covers an orthographic projection of the first filling layer on the flexible base substrate. In a direction perpendicular to the display substrate, a cross-sectional shape of the second isolation groove may be a shape of a Chinese character "凵". In this example, by forming the second isolation groove at the flexible base substrate filled with the first filling layer, an organic emitting layer and a cathode of a light emitting element may be separated, thereby improving reliability of encapsulation of the display substrate.

In some exemplary implementation modes, the display substrate may further include a second planarization layer located on a side of the first planarization layer away from the flexible base substrate, and a passivation layer located on a side of the second planarization layer away from the flexible base substrate. The connection bridge region is provided with a first isolation groove formed by penetrating the passivation layer and a part of the second planarization layer. The passivation layer has a first protruding part, and an orthographic projection of the first protruding part on the flexible base substrate is located in an orthographic projection of the first isolation groove on the flexible base substrate. In this example, the first isolation groove is formed in the second planarization layer, and the first protruding part of the passivation layer is located at a notch of the first isolation groove so that an orthographic projection of the notch of the first isolation groove on the flexible base substrate is located in the orthographic projection of the first isolation groove on the flexible base substrate. In the direction perpendicular to the display substrate, a cross-sectional shape of the first isolation groove may be a shape of a Chinese character "冂". In this example, by forming the first isolation groove in the connection bridge region, an organic emitting layer and a cathode that are formed in a pixel island region close to a hole region may be separated at the first isolation groove, thereby preventing water, oxygen, or the like in the hole region from eroding a light emitting element.

In some exemplary implementation modes, the encapsulation layer may include a first inorganic encapsulation layer, an organic encapsulation layer, and a second inorganic encapsulation layer that are stacked. In this example, a three-layer encapsulation structure of inorganic, organic, and inorganic is adopted for the encapsulation layer, which may improve an encapsulation effect.

Solutions of the embodiment will be described below through some examples.

Figure 2:
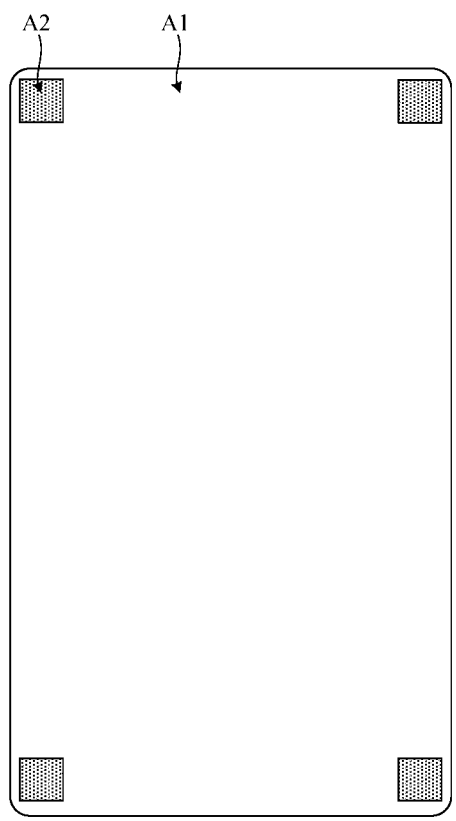
FIG. 2 is a schematic diagram of a display substrate according to at least one embodiment of the present disclosure.

FIG. 2 is a schematic diagram of a display substrate according to at least one embodiment of the present disclosure. In some exemplary implementation modes, as shown in FIG. 2, a display region of the display substrate may include a main display region A1 and at least one stretch display region A2 (e.g. four stretch display regions). The display substrate may be a rectangular display substrate, the four stretch display regions A2 may be located in four corner regions of the display substrate, and rest of the display region is the main display region. In this example, since four sides of the display substrate are bent, stress may be released by setting stretch display regions at the four corner regions, and breakage may be avoided when the display substrate is bent. However, this embodiment is not limited thereto. In some examples, a stretch display region may be provided at any position where the display region of the display substrate needs to be bent. For example, the display substrate may be a triangular display substrate and the display substrate may include three stretch display regions which may be located in three corner regions of the display substrate. For another example, a stretch display region may be provided at a position close to a side of the display substrate. Therefore, a stretchable function of a corresponding local region of the display substrate may be achieved.

In some exemplary implementation modes, as shown in FIG. 2, the stretch display region A2 may be rectangular. However, this embodiment is not limited thereto. For example, the stretch display region may be circular, pentagonal, or in another shape.

Figure 3:
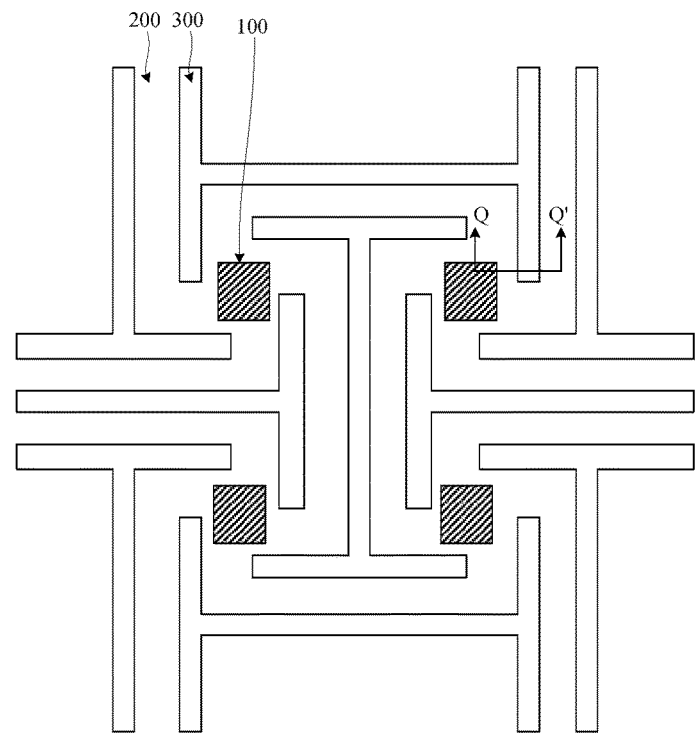
FIG. 3 is a schematic partial view of a stretch display region of a display substrate according to at least one embodiment of the present disclosure.

FIG. 3 is a schematic partial view of a stretch display region of a display substrate according to at least one embodiment of the present disclosure. FIG. 3 illustrates a structure of a partial region of the stretch display region, which may be regarded as a repeating unit of the stretch display region.

In some exemplary implementation modes, as shown in FIG. 3, in a plane parallel to the display substrate, the stretch display region A2 of the display substrate may include multiple pixel island regions 100 spaced apart from each other, a hole region 300 located between adjacent pixel island regions 100, and a connection bridge region 200 connecting adjacent pixel island regions 100 with each other. A periphery of each pixel island region 100 may be surrounded by multiple hole regions 300, a connection bridge region 200 may be located between a pixel island region and a hole region 300, and a connection bridge region 200 may be located between adjacent hole regions 300. A pixel island region 100 is used for image display, a hole region 300 is used for providing deformation space during stretching, and a connection bridge region 200 is used for wiring (signal communication between adjacent pixel island regions 100) and transferring a pulling force.

In some exemplary implementation modes, each pixel island region 100 may include one or more pixel units, and each pixel unit may include three light emitting units (e.g., red, green, and blue) emitting light of different colors or four light emitting units (e.g., red, green, blue, and white) emitting light of different colors. Each light emitting unit may include a light emitting element and a pixel circuit configured to drive the light emitting element to emit light. The light emitting element may be an OLED device including an anode, an organic emitting layer, and a cathode that are stacked. The organic emitting layer emits light at a voltage between the anode and the cathode. When a stretch display region is stretched under an action of an external force, deformation mainly occurs in a connection bridge region 200, and light emitting units of a pixel island region 100 maintain basically their shapes without being damaged. However, this embodiment is not limited thereto. For example, a light emitting element of a light emitting unit may be provided in a pixel island region, while a pixel circuit may not be provided in the pixel island region, for example, the pixel circuit may be provided in a connection bridge region or a peripheral region around a periphery of the display region.

In some exemplary implementation modes, as shown in FIG. 3, on a plane parallel to the display substrate, multiple connection bridge regions 200 may connect multiple pixel island regions 100 with each other. Each pixel island region 100 may be rectangular. However, this embodiment is not limited thereto. In some examples, a pixel island region may be in a shape of a circle, a regular polygon, or in another irregular shape. Or, in some examples, shapes of multiple pixel island regions may be different.

In some exemplary implementation modes, as shown in FIG. 3, on a plane parallel to the display substrate, when the display substrate is in an unstretched state, a hole region 300 may be in a shape of a Chinese character "工", in a shape of a T, in a shape of an L, in a shape of a rectangle, in a shape of an arc, in a shape of a Chinese character "—", or the like. In some examples, each hole region 300 may be regarded as a through hole and a width of the through hole may be about 10 microns to 500 microns. A connection bridge region 200 is located between a pixel island region 100 and a hole region 300, or is located between adjacent hole region 300 and connected with an adjacent pixel island region 100. The connection bridge region 200 may be in a shape of an L, or in a shape of multiple L shapes that are connected, such as in a "⌣" shape and in a shape of a T. A width of the connection bridge region 200 may be about 10 microns to 500 microns. However, this embodiment is not limited thereto.

Figure 4:
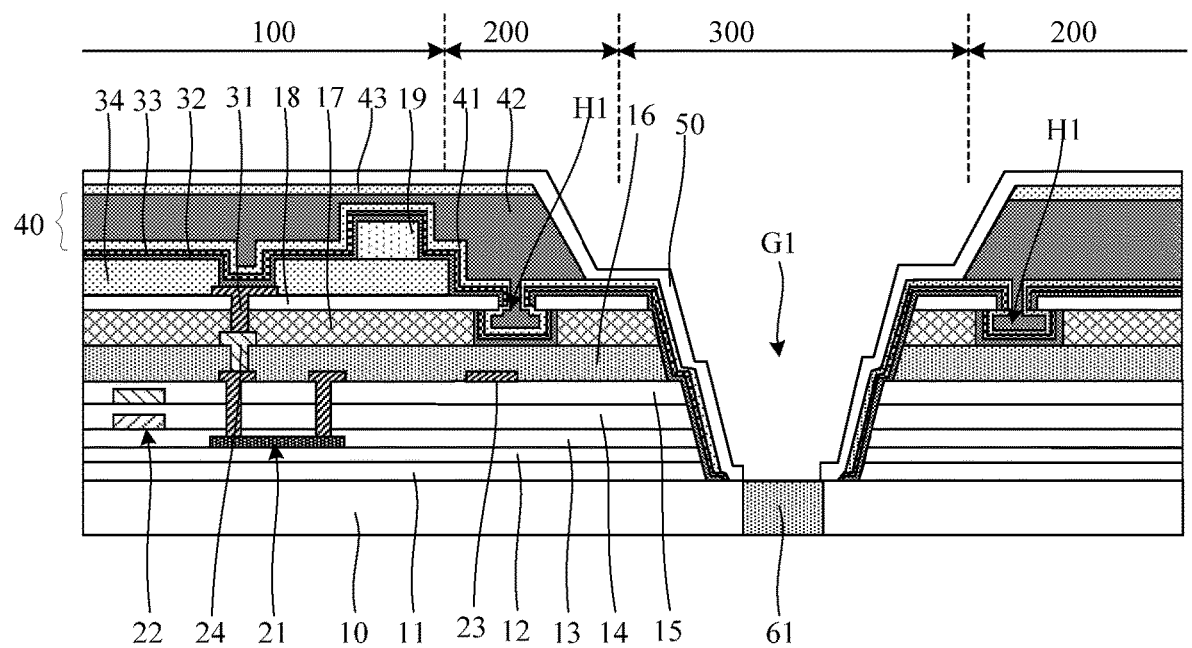
FIG. 4 is a schematic partial sectional view along a Q-Q' direction in FIG. 3.

FIG. 4 is a schematic partial sectional view along a Q-Q' direction in FIG. 3. In some exemplary implementation modes, as shown in FIG. 4, in a direction perpendicular to the display substrate, a pixel island region 100 may include a flexible base substrate 10, a drive structure layer, an emitting structure layer, an encapsulation layer 40, and a buffer protection layer 50 that are sequentially disposed on the flexible base substrate 10. The drive structure layer may include multiple gate lines and multiple data lines, the multiple gate lines and the multiple data lines vertically intersect to define multiple sub-pixel regions, and each sub-pixel region is provided with a pixel circuit. Each pixel circuit includes multiple transistors and at least one capacitor, for example, it may be of a 2T1C (two transistors and one capacitor), 3T1C (three transistors and one capacitor), or 7T1C (seven transistors and one capacitor) structure. The emitting structure layer may include multiple light emitting elements. Multiple pixel circuits and multiple light emitting elements may be electrically connected one by one. In FIG. 4, only one light emitting element of the pixel island region 100, and one transistor and one capacitor of the pixel circuit are taken as an example for illustration.

In some exemplary implementation modes, as shown in FIG. 4, in a direction perpendicular to the display substrate, the connection bridge region 200 may include a flexible base substrate 10, a composite insulation layer provided on the flexible base substrate 10, a signal line provided on the composite insulation layer (only one signal line 23 is used for illustration in FIG. 4), and a first planarization layer 16, a second planarization layer 17, a passivation layer 18, an encapsulation layer 40, and a buffer protection layer 50 that sequentially cover the signal line. In this example, the composite insulation layer is an inorganic composite insulation layer including multiple inorganic layers. The inorganic composite insulation layer may include a first insulation layer 11, a second insulation layer 12, a third insulation layer 13, a fourth insulation layer 14, and a fifth insulation layer 15 that are stacked on the flexible base substrate 10. The connection bridge region 200 is further provided with a first isolation groove H1 formed by penetrating the passivation layer 18 and the second planarization layer 17. The passivation layer 18 has a first protruding part for shielding a part of the first isolation groove H1, so that an orthographic projection of a notch of the first isolation groove H1 on the flexible base substrate 10 is located in an orthographic projection of the first isolation groove H1 on the flexible base substrate 10. In this example, the first insulation layer 11 to the fifth insulation layer 15 are all inorganic layers. However, this embodiment is not limited thereto. For example, the fifth insulation layer may be an organic layer.

In some examples, the signal line of the connection bridge region 200 is configured to achieve signal communication between adjacent pixel island regions 100. For example, a signal is transmitted to or from a pixel island region 100. Signal communication between adjacent pixel island regions 100 refers to signal communication between a light emitting unit in one pixel island region 100 and a light emitting unit in another adjacent pixel island region 100. Multiple signal lines of the connection bridge regions 200, for example, may include a connection line connecting gate lines in adjacent pixel island regions 100, a connection line connecting data lines in adjacent pixel island regions 100, and a connection line of power signals. In some examples, the multiple signal lines may be multiple flexible signal lines.

In some exemplary implementation modes, as shown in FIG. 4, in a direction perpendicular to the display substrate, the flexible base substrate 10 of a hole region 300 has a first through hole that penetrates the flexible base substrate 10. A first filling layer 61 is filled in the first through hole. The hole region 300 also has a first opening G1. The first opening G1 exposes the first filling layer 61 filled in the first through hole. The hole region 300 is provided with the first opening G1 to provide deformation space during stretching, so as to achieve a stretching effect.

In some exemplary implementation modes, as shown in FIG. 4, the encapsulation layer 40 of a pixel island region 100 and a connection bridge region 200 may include a first inorganic encapsulation layer 41, an organic encapsulation layer 42, and a second inorganic encapsulation layer 43 that are stacked. In a hole region 300, a sidewall of the first opening G1 is covered with the first inorganic encapsulation layer 41, and an orthographic projection of the first inorganic encapsulation layer 41 on the flexible base substrate 10 is not overlapped with the first filling layer 61. That is, the encapsulation layer 40 does not cover the first filling layer 61 in the hole region 300, so that a stretching effect of the display substrate may be ensured. However, this embodiment is not limited thereto. In some examples, the orthographic projection of the first inorganic encapsulation layer 41 on the flexible base substrate 10 may be partially overlapped with the first filling layer 61, for example, the first inorganic encapsulation layer 41 may cover an edge of the first filling layer 61.

Technical solutions of the embodiment will be described illustratively with reference to FIG. 5A to FIG. 5K through an example of a preparation process of the display substrate of the embodiment. Schematic structural diagrams of FIG. 5A to FIG. 5K are all partial sectional views along the Q-Q' direction in FIG. 3.

A "patterning process" mentioned in the embodiments includes processes, such as photoresist coating, mask exposure, development, etching, and photoresist stripping, for a metal material, an inorganic material, or a transparent conductive material, and includes processes, such as organic material coating, mask exposure, and development, for an organic material. Deposition may be implemented by using any one or more of sputtering, evaporation, and chemical vapor deposition, coating may be implemented by using any one or more of spraying coating, spin coating, and ink-jet printing, and etching may be implemented by using any one or more of dry etching and wet etching, which are not limited in the present disclosure. A "thin film" refers to a layer of thin film formed by a material on a base substrate through deposition, coating, or other processes. If the "thin film" does not need a patterning process in an entire preparation process, the "thin film" may also be called a "layer". If the "thin film" needs the patterning process in the entire preparation process, it is called a "thin film" before the patterning process, and called a "layer" after the patterning process. The "layer" after the patterning process includes at least one "pattern".

"A and B are disposed in a same layer" in the embodiments of the present disclosure, refers to that A and B are formed simultaneously through a same patterning process. The "same layer" does not always mean that thicknesses of layers or heights of layers are the same in a sectional view. "An orthographic projection of A contains an orthographic projection of B" refers to that an orthographic projection of B falls in a range of an orthographic projection of A or an orthographic projection of A covers an orthographic projection of B.

The preparation process of the display substrate of the embodiment may include following acts.

(1) Preparing a flexible base substrate 10 on a glass substrate 60. In some exemplary implementation modes, a flexible material is coated on the glass substrate 60 and is cured into a film to form the flexible base substrate 10. In some examples, a thickness of the flexible base substrate 10 may range from about 6 microns (μm) to 10 μm. In some examples, the flexible material may be polyimide (PI), polyethylene terephthalate (PET), or a surface-treated polymer soft film, or the like.

Figure 5A:
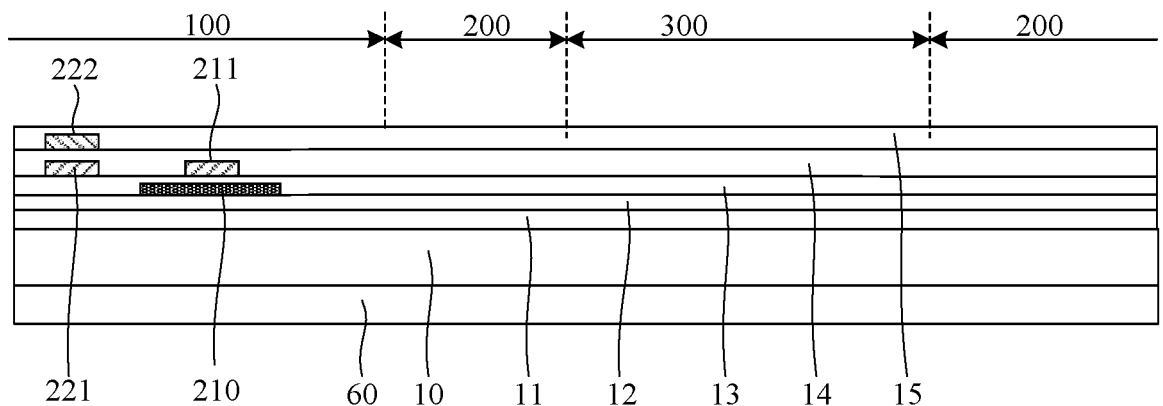
FIG. 5A to FIG. 5K are schematic diagrams of a preparation process of a display substrate according to at least one embodiment of the present disclosure.

After this process, a pixel island region 100, a connection bridge region 200, and a hole region 300 all include a flexible base substrate 10, as shown in FIG. 5A.

(2) Sequentially preparing a first insulation layer 11, a second insulation layer 12, a semiconductor layer, a third insulation layer 13, a first metal layer, a fourth insulation layer 14, a second metal layer, and a fifth insulation layer 15 on the flexible base substrate 10.

In some exemplary implementation modes, as shown in FIG. 5A, a first insulation thin film and a second insulation thin film are sequentially deposited on the flexible base substrate 10 to form the first insulation layer 11 and the second insulation layer 12 covering the entire flexible base substrate 10.

Subsequently, a semiconductor thin film is deposited and patterned through a patterning process to form the semiconductor layer disposed on the second insulation layer 12, the semiconductor layer at least includes a first active layer 210 located in the pixel island region 100.

Subsequently, a third insulation thin film and a first metal thin film are sequentially deposited and the first metal thin film is patterned through a patterning process to form the third insulation layer 13 covering the semiconductor layer and the first metal layer disposed on the third insulation layer 13. The first metal layer at least includes a first gate electrode 211 and a first capacitor electrode 221 located in the pixel island region 100.

Subsequently, a fourth insulation thin film and a second metal thin film are sequentially deposited and the second metal thin film is patterned through a patterning process to form the fourth insulation layer 14 covering the first metal layer and the second metal layer disposed on the fourth insulation layer 14. The second metal layer at least includes a second capacitor electrode 222 located in the pixel island region 100. Orthographic projections of the second capacitor electrode 222 and the first capacitor electrode 221 on the flexible base substrate 10 are overlapped.

Then, a fifth insulation thin film is deposited to form the fifth insulation layer 15 covering the second metal layer.

After this process, both the connection bridge region 200 and the hole region 300 may include the first insulation layer 11, the second insulation layer 12, the third insulation layer 13, the fourth insulation layer 14, and the fifth insulation layer 15 that are sequentially disposed on the flexible base substrate 10. The first insulation layer 11 to the fifth insulation layer 15 may be collectively referred to as an inorganic composite insulation layer.

In some exemplary implementation modes, the first insulation layer 11, the second insulation layer 12, the third insulation layer 13, the fourth insulation layer 14, and the fifth insulation layer 15 may be made of any one or more of Silicon Oxide (SiOx), Silicon Nitride (SiNx), and Silicon Oxynitride (SiON), and may be a single layer, a multi-layer, or a composite layer. The first insulation layer 11 may also be referred to as a barrier layer, the second insulation layer 12 may also be referred to as a buffer layer, and the first insulation layer 11 and the second insulation layer 12 may be used for improving water oxygen resistance of the flexible base substrate 10. The third insulation layer 13 and the fourth insulation layer 14 may also be referred to as Gate Insulator (GI) layers; the fifth insulation layer 15 may also be referred to as an Inter Layer Dielectric (ILD) layer.

In some exemplary implementation modes, the first metal thin film and the second metal thin film are made of metal materials, such as any one or more of silver (Ag), copper (Cu), aluminum (Al), titanium (Ti), and molybdenum (Mo), or alloy materials of the above metals, such as an Aluminum Neodymium alloy (AlNd) or a Molybdenum Niobium alloy (MoNb), and may be of a single-layer structure or a multi-layer composite structure, such as Ti/Al/Ti. The semiconductor thin film is made of one or more materials such as amorphous Indium Gallium Zinc Oxide (a-IGZO), Zinc Oxynitride (ZnON), Indium Zinc Tin Oxide (IZTO), amorphous Silicon (a-Si), polysilicon (p-Si), sexithiophene, and polythiophene. That is, the present disclosure is applicable to transistors manufactured based on an oxide technology, a silicon technology, and an organic matter technology.

(3) Etching the inorganic composite insulation layer in the hole region 300 to form a second through hole K2.

Figure 5B:
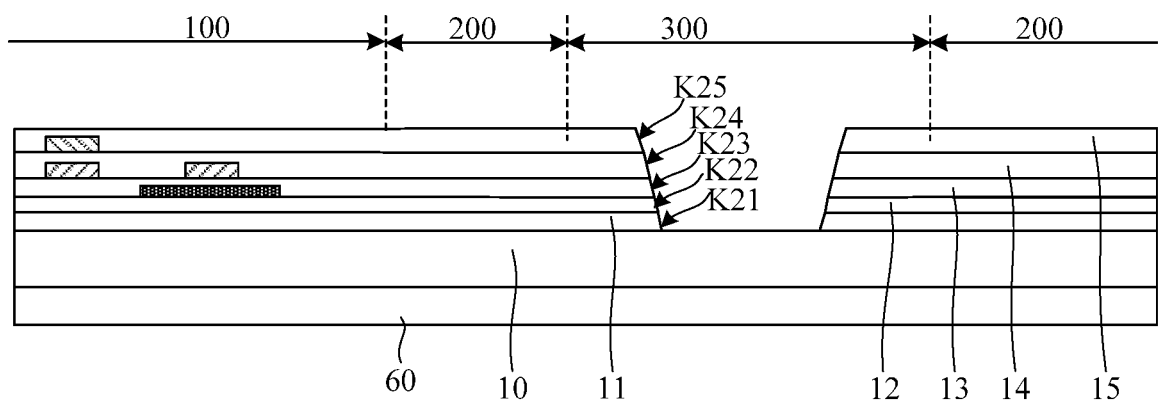

In some exemplary implementation modes, the fifth insulation layer 15, the fourth insulation layer 14, the third insulation layer 13, the second insulation layer 12, and the first insulation layer 11 are etched to form the second through hole K2 exposing a surface of the flexible base substrate 10 in the hole region 300, as shown in FIG. 5B. In some examples, the fifth insulation layer 15 of the hole region 300 is provided with a fifth via K25 that exposes a surface of the fourth insulation layer 14. A fourth via K24 is formed in a part of the fourth insulation layer 14 exposed by the fifth via K25, and the fourth via K24 exposes a surface of the third insulation layer 13. A third via K23 is formed in a part of the third insulation layer 13 exposed by the fourth via K24, and the third via K23 exposes a surface of the second insulation layer 12. A second via K22 is formed in a part of the second insulation layer 12 exposed by the third via K23, and the second via K22 exposes a surface of the first insulation layer 11. A first via K21 is formed in a part of the first insulation layer 11 exposed by the second via K22. The first via K21 to the fifth via K25 communicate to form the second through hole K2.

In some examples, an orthographic projection of the fifth via K25 on the flexible base substrate 10 includes an orthographic projection of the fourth via K24 on the flexible base substrate 10, the orthographic projection of the fourth via K24 on the flexible base substrate 10 includes an orthographic projection of the third via K23 on the flexible base substrate 10, the orthographic projection of the third via K23 on the flexible base substrate 10 includes an orthographic projection of the second via K22 on the flexible base substrate 10, the orthographic projection of the second via K22 on the flexible base substrate 10 includes an orthographic projection of the first via K21 on the flexible base substrate 10. In other words, a size of the first via K21 may be smaller than a size of the second via K22, the size of the second via K22 may be smaller than a size of the third via K23, the size of the third via K23 may be smaller than a size of the fourth via K24, and the size of the fourth via K24 may be smaller than a size of the fifth via K25. However, this embodiment is not limited thereto. For example, sizes of the first via, the second via, the third via, the fourth via, and the fifth via may be substantially the same.

In some examples, the second through hole K2 may be rectangular or circular in a plane parallel to the display substrate. In a direction perpendicular to the display substrate, a cross-sectional shape of the second through hole K2 may be an inverted trapezoid. However, this embodiment is not limited thereto.

In the present disclosure, a hole size refers to a measure of a size of a hole. For example, for a circular hole, it may be an aperture; for a square hole, it may be a side length.

After this process, film layer structures of the pixel island region 100 and the connection bridge region 200 are not changed.

(4) Etching the flexible base substrate 10 to form a first through hole K1 in the hole region 300.

Figure 5C:
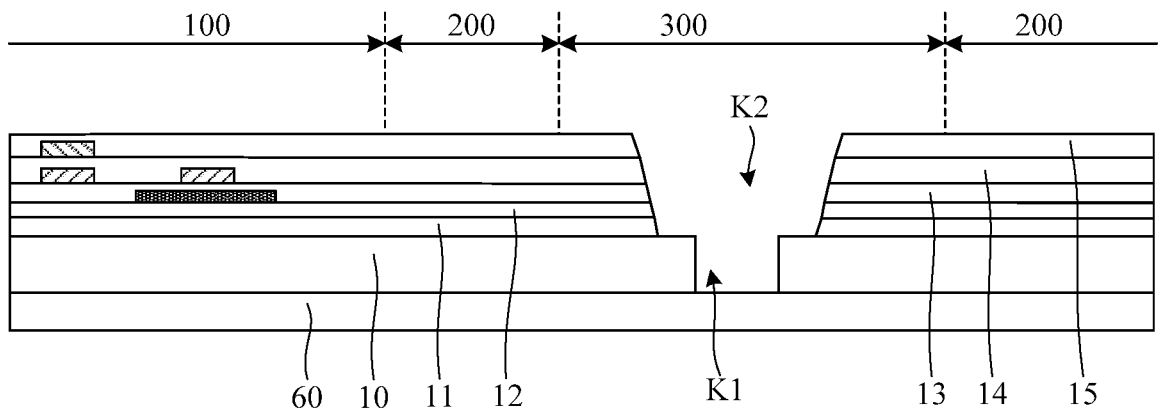

In some exemplary implementation modes, the flexible base substrate 10 is etched with the fifth insulation layer 15 as a mask, and the first through hole K1 is formed in the flexible base substrate 10 of the hole region 300, as shown in FIG. 5C. The first through hole K1 penetrates the flexible base substrate 10 and penetrates the second through hole K2. An orthographic projection of the second through hole K2 on the flexible base substrate 10 covers the first through hole K1. In some examples, the first through hole K1 may be rectangular or circular in a plane parallel to the display substrate. In a direction perpendicular to the display substrate, a cross-sectional shape of the first through hole K1 may be a rectangle. However, a shape of the first through hole K1 is not limited in the embodiment.

After this process, the film layer structures of the pixel island region 100 and the connection bridge region 200 are not changed.

(5) Forming a third metal layer on the flexible base substrate 10 on which the aforementioned patterns are formed.

In some exemplary implementation modes, the fifth insulation layer 15 is patterned through a patterning process, and at least one first connection hole is formed in the fifth insulation layer 15 of the pixel island region 100. The fifth insulation layer 15, the fourth insulation layer 14, and the third insulation layer 13 in the first connection hole are etched away to expose a surface of the semiconductor layer.

Figure 5D:
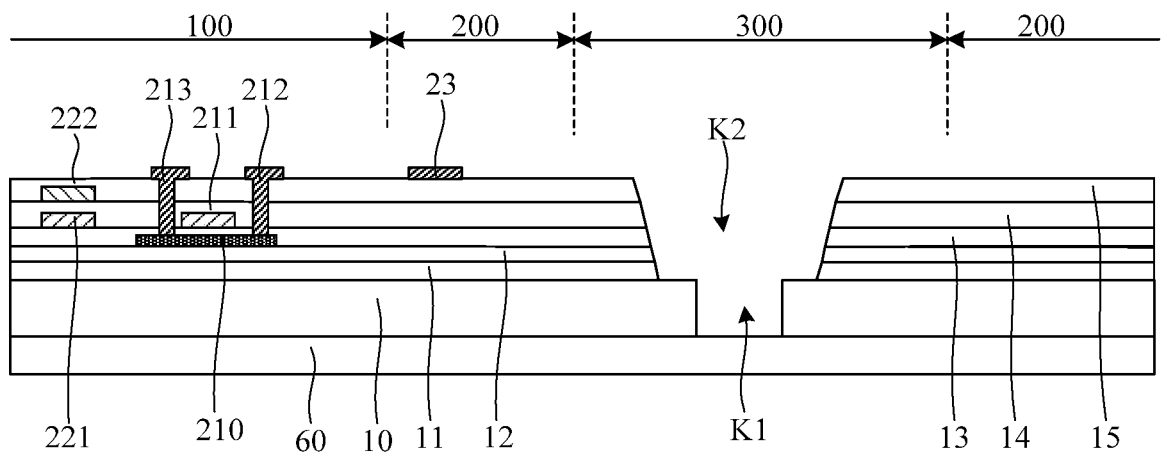

Subsequently, a third metal thin film is deposited, and the third metal thin film is patterned through a patterning process to form the third metal layer, as shown in FIG. 5D. The third metal layer at least includes a first source electrode 212 and a first drain electrode 213 located in the pixel island region 100 and a signal line 23 located in the connection bridge region 200. The first source electrode 212 may be electrically connected with a first doped region of the first active layer 210 through one first connection hole, and the first drain electrode 213 may be electrically connected with a second doped region of the first active layer 210 through another first connection hole. The signal line 23 of the connection bridge region 200 may be configured to achieve signal communication between adjacent pixel island regions 100. In some examples, the signal line 23 may be a connection line connecting gate lines in adjacent pixel island regions 100, or a connection line connecting data lines in adjacent pixel island regions 100, or a connection line of power signals. However, this embodiment is not limited thereto. In some examples, a connection line disposed within the connection bridge region 200 configured to connect gate lines in adjacent pixel island region 100 may be located in the first metal layer or the second metal layer.

So far, preparation of a drive structure layer of multiple pixel island regions 100 on the flexible base substrate 10 is completed. As shown in FIG. 4, in a drive structure layer of one pixel island region 100, a first active layer 210, a first gate electrode 211, a first source electrode 212, and a first drain electrode 213 may constitute a first transistor 21, and a first capacitor electrode 221 and a second capacitor electrode 222 may constitute a first capacitor 22.

After this process, the connection bridge region 200 includes the inorganic composite insulation layer and the signal line 23 that are stacked on the flexible base substrate 10. A film layer structure of the hole region 300 is not changed.

(6) Forming a first planarization layer 16 and a first filling layer 61 on the flexible base substrate 10 formed with the aforementioned patterns.

Figure 5E:
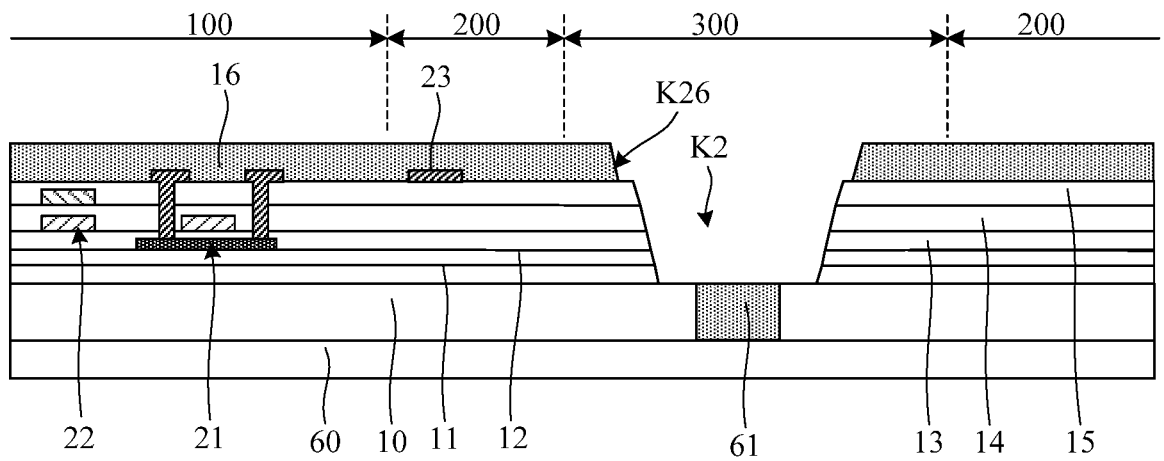

In some exemplary implementation modes, a first planarization thin film made of an organic material is coated on the flexible base substrate 10 on which the aforementioned patterns are formed, and the first planarization thin film is patterned through a patterning process to form the first planarization layer 16 and the first filling layer 61, as shown in FIG. 5E. The first planarization layer 16 is located in the connection bridge region 200 and the pixel island region 100, and the first filling layer 61 is located in the hole region 300. The first planarization layer 16 covers the third metal layer and the first filling layer 61 is filled in the first through hole K1 of the flexible base substrate 10. The first planarization layer 16 is provided with a sixth via K26 in the hole region 300, and the sixth via K26 communicates with the second via K2. An orthographic projection of the sixth via K26 on the flexible base substrate 10 may contain an orthographic projection of the second through hole K2 on the flexible base substrate 10.

In some exemplary implementation modes, a surface of the first filling layer 61 away from the glass substrate 60 may be flush with a surface of the flexible base substrate 10 away from the glass substrate 60. However, this embodiment is not limited thereto. For example, the surface of the first filling layer 61 away from the glass substrate 60 may be slightly lower than the surface of the flexible base substrate 10 away from the glass substrate 60, or may be slightly higher than the surface of the flexible base substrate 10 away from the glass substrate 60.

In this example, by filling the first filling layer 61 in the first through hole K1 of the flexible base substrate 10, a deep hole exposure residue problem existing in a subsequent process may be avoided, and tensile properties of the display substrate may be improved. The first filling layer 61 and the first planarization layer 16 are disposed in a same layer, which may simplify a process. Moreover, the first filling layer 61 and the flexible base substrate 10 may be made of organic materials with different adhesions, so that they have poor adhesion to each other, so as to avoid an influence on stretching of the flexible base substrate 10, thereby achieving a stretchable effect similar to that of using a through hole structure on the flexible base substrate.

(7) Sequentially forming a fourth metal layer, a second planarization layer 17, a passivation layer 18, an anode layer, a pixel definition layer 34, and a post spacer 19 on the flexible base substrate 10 formed with the aforementioned patterns.

Figure 5F:
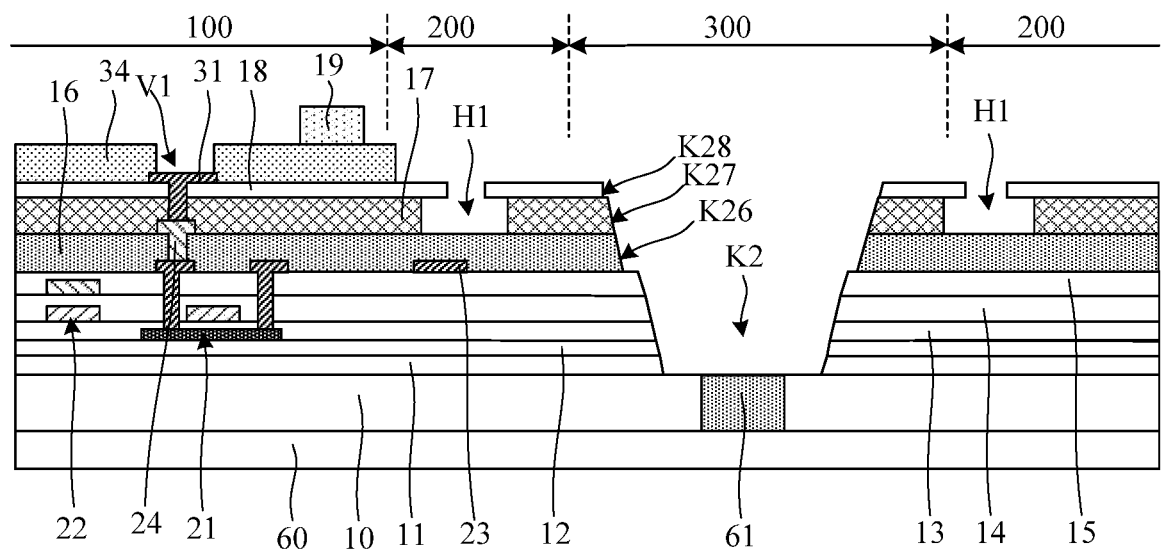

In some exemplary implementation modes, the first planarization layer 16 is patterned through a patterning process, and at least one second connection hole is formed in the first planarization layer 16 of the pixel island region 100. The first planarization layer 16 in the second connection hole is removed to expose a surface of the third metal layer, as shown in FIG. 5F. After this process, film layer structures of the connection bridge region 200 and the hole region 300 are not changed.

Subsequently, a fourth metal thin film is deposited, and the fourth metal thin film is patterned through a patterning process to form a fourth metal layer, as shown in FIG. 5F. The fourth metal layer includes at least a connection electrode 24 located in the pixel island region 100. The connection electrode 24 may be electrically connected with the first drain electrode 213 of the first transistor 21 through the second connection hole. After this process, the film layer structures of the connection bridge region 200 and the hole region 300 are not changed.

Subsequently, a second planarization thin film made of an organic material is coated on the flexible base substrate 10 on which the aforementioned patterns are formed, the second planarization thin film is patterned through a patterning process, and a second planarization layer 17 covering the fourth metal layer is formed in the pixel island region 100 and the connection bridge region 200, as shown in FIG. 5F. The second planarization layer 17 is provided with a seventh via K27 in the hole region 300, and the seventh via K27 communicates with the sixth via K26. An orthographic projection of the seventh via K27 on the flexible base substrate 10 may contain an orthographic projection of the sixth via K26 on the flexible base substrate 10. After this process, a film layer structure of the hole region 300 is not changed.

Subsequently, a passivation thin film is deposited on the flexible base substrate 10 on which the aforementioned patterns are formed, and the passivation thin film is patterned through a patterning process to form a passivation layer 18 in the pixel island region 100 and the connection bridge region 200. At least one third connection hole is formed in the passivation layer 18 of the pixel island region 100. The passivation layer 18 and the second planarization layer 17 in the third connection hole are removed to expose a surface of the fourth metal layer. The passivation layer 18 is provided with an eighth via K28 in the hole region 300, and the eighth via K28 communicates with the seventh via K27. An orthographic projection of the eighth via K28 on the flexible base substrate 10 may contain an orthographic projection of the seventh via K27 on the flexible base substrate 10. After this process, the film layer structure of the hole region 300 is not changed. In this example, the eighth via K28, the seventh via K27, the sixth through hole K27, and the second through hole K2 communicate to form the first opening G1 of the hole region 300.

Subsequently, a first conductive thin film is deposited and patterned through a patterning process to form an anode layer, as shown in FIG. 5F. The anode layer is formed on the passivation layer 18 of the pixel island region 100. The anode layer includes multiple anodes. In FIG. 5F, only one anode 31 is taken as an example for illustration. The anode 31 is electrically connected with the connection electrode 24 through the third connection hole, and is electrically connected with the first drain electrode 213 of the first transistor 21 through the connection electrode 24. In some examples, the anode may be a reflective anode. For example, the anode layer may include a first light-transmitting conductive layer, a reflective layer, and a second light-transmitting conductive layer that are stacked. The first light-transmitting conductive layer and the second light-transmitting conductive layer may be made of a light-transmitting conductive material such as Indium Tin Oxide (ITO) or Indium Zinc Oxide (IZO). The reflective layer may be a metal layer, for example, made of silver. However, this embodiment is not limited thereto. In some examples, the first conductive thin film may be made of a metal material, such as any one or more of magnesium (Mg), silver (Ag), copper (Cu), aluminum (Al), titanium (Ti), and molybdenum (Mo), or an alloy material of the above metals, such as an Aluminum Neodymium alloy (AlNd) or a Molybdenum Niobium alloy (MoNb), and may have a single-layer structure or a multi-layer composite structure, such as Ti/Al/Ti. After this process, the film layer structures of the connection bridge region 200 and the hole region 300 are not changed.

Subsequently, a pixel definition thin film is coated on the flexible base substrate 10 on which the aforementioned patterns are formed, the pixel definition thin film is patterned through a patterning process, and a pixel definition layer 34 is formed in the pixel island region 100, as shown in FIG. 5F. The pixel definition layer 34 of the pixel island region 100 is provided with multiple pixel openings. Only one pixel opening V1 is taken as an example for illustration in FIG. 5F. The pixel definition layer 34 in the pixel opening V1 is developed, exposing a surface of the anode 31. In some examples, the pixel definition layer 34 may be made of a material such as polyimide, acrylic, or polyethylene terephthalate. After this process, the film layer structures of the connection bridge region 200 and the hole region 300 are not changed.

Subsequently, a post spacer thin film is coated on the flexible base substrate 10 on which the aforementioned patterns are formed, the post spacer thin film is patterned through a patterning process, and a post spacer 19 is formed in the pixel island region 100 and the connection bridge region 200, as shown in FIG. 5F. In some examples, the post spacer 19 may be made of a material such as polyimide, acrylic, or polyethylene terephthalate. After this process, the film layer structure of the hole region 300 is not changed.

Subsequently, photoresist is coated on the passivation layer 18, the photoresist is exposed and then developed to form an isolation hole penetrating the passivation layer 18. Then, at least a part of the second planarization layer 17 is dry-etched using the passivation layer 18 with the isolation hole as a mask to form a first groove in the second planarization layer 17. The isolation hole of the passivation layer 18 communicates with the first groove of the second planarization layer 17, and an orthographic projection of the first groove on the flexible base substrate 10 contains an orthographic projection of the isolation hole on the flexible base substrate 10. In this example, the isolation hole of the passivation layer 18 and the first groove of the second planarization layer 17, form a first isolation groove H1. The passivation layer 18 has a first protruding part over the first groove. An orthographic projection of the first protruding part of the passivation layer 18 on the flexible base substrate 10 is located in the orthographic projection of the first groove on the flexible base substrate 10. The first protruding part of the passivation layer 18 partially shields a notch of the first isolation groove H1 so that an orthographic projection of the notch of the first isolation groove H1 is within the orthographic projection of the first groove on the flexible base substrate 10. A size of the notch of the first isolation groove H1 may be determined by a size of the isolation hole of the passivation layer 18. In a direction perpendicular to the display substrate, a cross-sectional shape of the first isolation groove H1 may be a shape of a Chinese character "凸". After this process, the film layer structure of the hole region 300 is not changed.

In some examples, the first isolation groove H1 may be located in the connection bridge region 200 adjacent to the hole region 300. The first isolation groove H1 is used for isolating an organic emitting layer and a cathode in the pixel island region 100 or the connection bridge region 200 close to the hole region 300, so that water vapor cannot invade a light emitting element from the hole region 300 along the organic emitting layer and the cathode to damage it.

In some examples, a depth of the first isolation groove H1 may be about 1.5 μm to 2.5 μm to ensure that its drop depth may completely isolate the organic emitting layer and the cathode. The depth of the first isolation groove H1 may be a distance between a surface of the first protruding part of the passivation layer 18 on a side adjacent to the flexible base substrate 10 and a bottom surface of the first groove.

(8) Sequentially forming an organic emitting layer 32 and a cathode 33 on the flexible base substrate 10 formed with the aforementioned patterns.

Figure 5G:
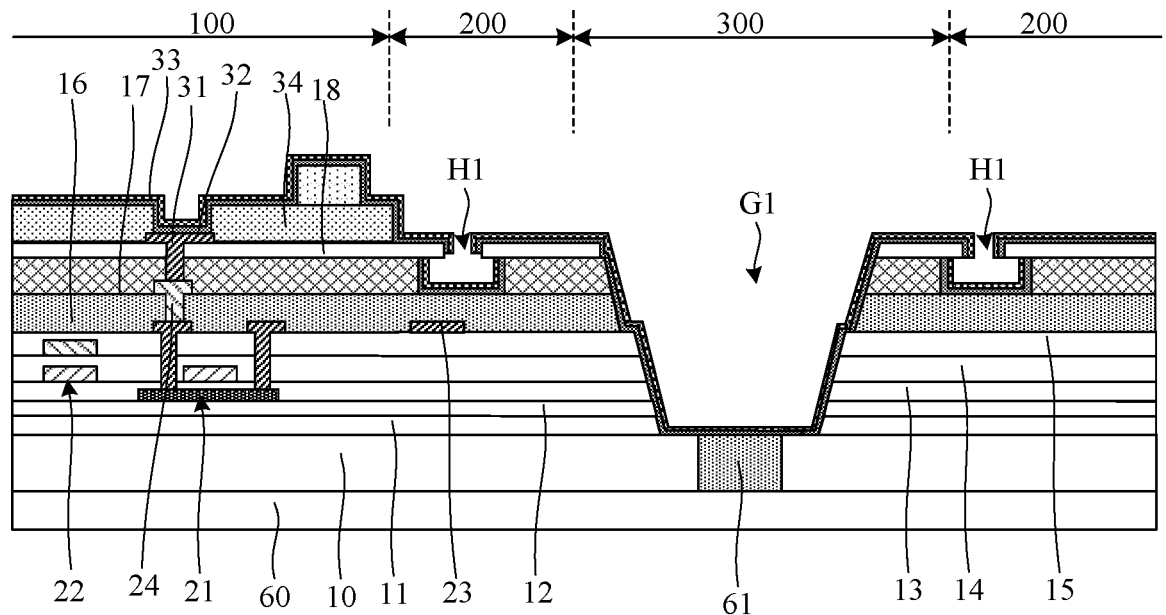

In some exemplary implementation modes, the organic emitting layer 32 and the cathode 33 may be formed in the pixel island region 100, the connection bridge region 200, and the hole region 300 using an evaporation process. The organic emitting layer 32 of the pixel island region 100 and the connection bridge region 200 may cover the pixel definition layer 34, and the organic emitting layer 32 of the pixel island region 100 may be in direct contact with the anode 31 exposed by the pixel opening V1 of the pixel definition layer 34. The organic emitting layer 32 of the connection bridge region 200 is located in the first isolation groove H1, and the organic emitting layer 32 of the hole region 300 covers a sidewall and a bottom of the first opening G1, as shown in FIG. 5G.

In some examples, the cathode 33 is formed on the organic emitting layer 32. The anode 31, the organic emitting layer 32, and the cathode 33, that are stacked, of the pixel island region 100 form the light emitting element. In some examples, the cathode 33 may be made of a light-transmitting conductive material such as ITO or IZO. The light emitting element may emit light from a side away from the flexible base substrate 10 through a transparent cathode so as to achieve top emission.

In some examples, the organic emitting layer 32 may include a hole injection layer, a hole transport layer, an emitting layer, an electron transport layer, and an electron injection layer that are stacked, which may improve an efficiency of injecting electrons and holes into the emitting layer. However, this embodiment is not limited thereto.

In this example, due to existence of the first isolation groove H1, the organic emitting layer 32 and the cathode 33 formed through evaporation are disconnected at the first isolation groove H1. By separating the organic emitting layer 32 and the cathode 33 of the pixel island region 100 and the connection bridge region 200, a water vapor intrusion path from the hole region 300 to the organic emitting layer 32 and the cathode 33 of the pixel island region 100 is completely blocked, and effectiveness and reliability of encapsulation may be ensured.

After this process, the emitting layer 32 and the cathode 33 are stacked on the flexible base substrate 10 of the hole region 300. The flexible base substrate 10 is filled with the first filling layer 61.

(9) Forming an encapsulation layer 7 on the flexible base substrate 10 formed with the aforementioned patterns.

Figure 5H:
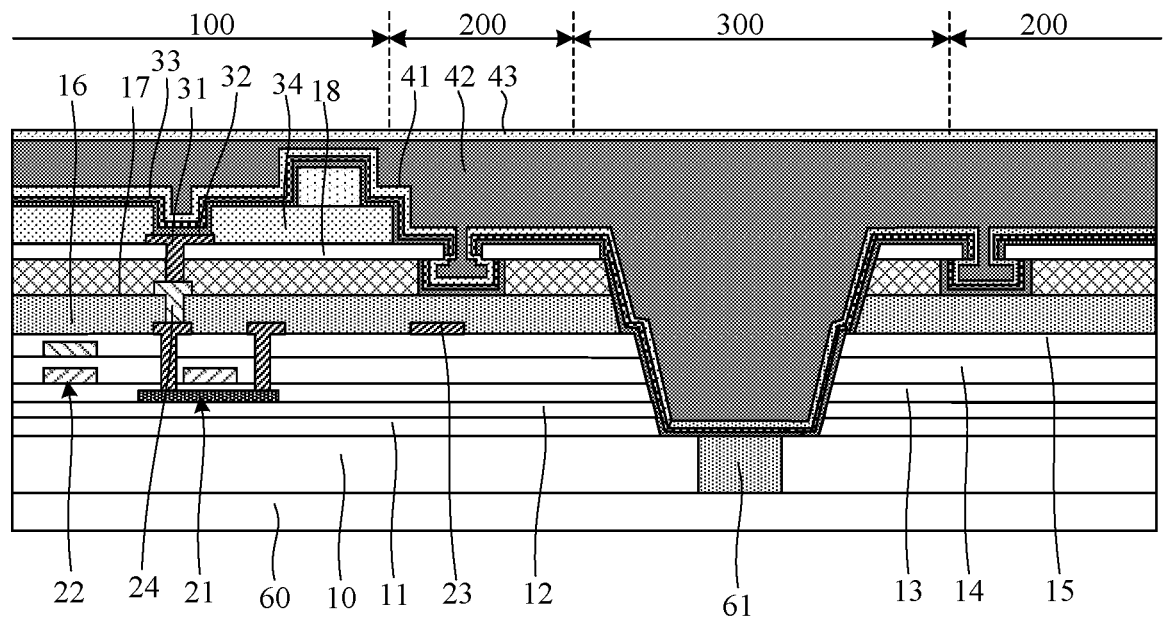

In some exemplary implementation modes, a first encapsulation thin film is deposited on the flexible base substrate 10 formed with the aforementioned patterns to form a first inorganic encapsulation layer 41 covering the entire flexible base substrate 10. Next, an organic encapsulation layer 42 is formed by using an inkjet printing process. Subsequently, a second encapsulation thin film is deposited to form a second inorganic encapsulation layer 43 covering the entire flexible base substrate 10. In this example, as shown in FIG. 5H, the encapsulation layer 40 is an inorganic-organic stacked structure including a three-layer structure of the first inorganic encapsulation layer 41, the organic encapsulation layer 42, and the second inorganic encapsulation layer 43 that are stacked. In some examples, an inorganic material may be silicon oxide, alumina, silicon nitride, or silicon oxynitride, etc. An organic material may be a flexible polymer material based on PET, which has a good encapsulation effect, may effectively prevent water and oxygen from entering the organic emitting layer, and has characteristics of flexible deformation, which may achieve stretching deformation of the display substrate. However, this embodiment is not limited thereto. For example, the encapsulation layer may be of a five-layer structure of inorganic/organic/inorganic/organic/inorganic.

After this process, the hole region 300 includes the flexible base substrate 10, the organic emitting layer 32, the cathode 33, the first inorganic encapsulation layer 41, the organic encapsulation layer 42, and the second inorganic encapsulation layer 43 which are sequentially stacked on the glass substrate 60. The flexible base substrate 10 is filled with the first filling layer 61.

(10) Etching the organic encapsulation layer 42 and the second inorganic encapsulation layer 43 of the hole region 300.

Figure 5I:
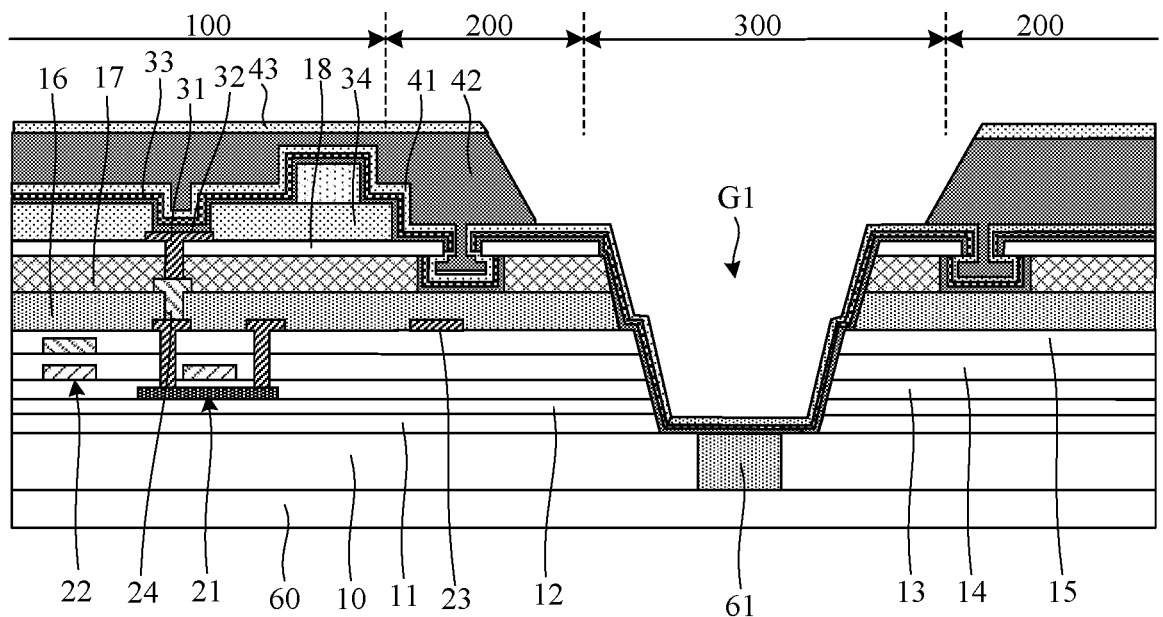

In some exemplary implementation modes, the second inorganic encapsulation layer 43 is patterned through a patterning process to remove the second inorganic encapsulation layer 43 of the hole region 300. The organic encapsulation layer 42 is patterned using the patterned second inorganic encapsulation layer 43 as a mask, and the organic encapsulation layer 42 in the first opening G1 of the hole region 300 is removed, as shown in FIG. 5I. In some examples, the organic encapsulation layer 42 may be etched using oxygen to avoid etching an inorganic encapsulation layer. After etching the second inorganic encapsulation layer 43 and the organic encapsulation layer 42 of the hole region 300, a surface of the first inorganic encapsulation layer 41 of the hole region 300 may be exposed.

(11) Patterning the organic emitting layer 32, the cathode 33, and the first inorganic encapsulation layer 41 in the hole region 300.

Figure 5J:
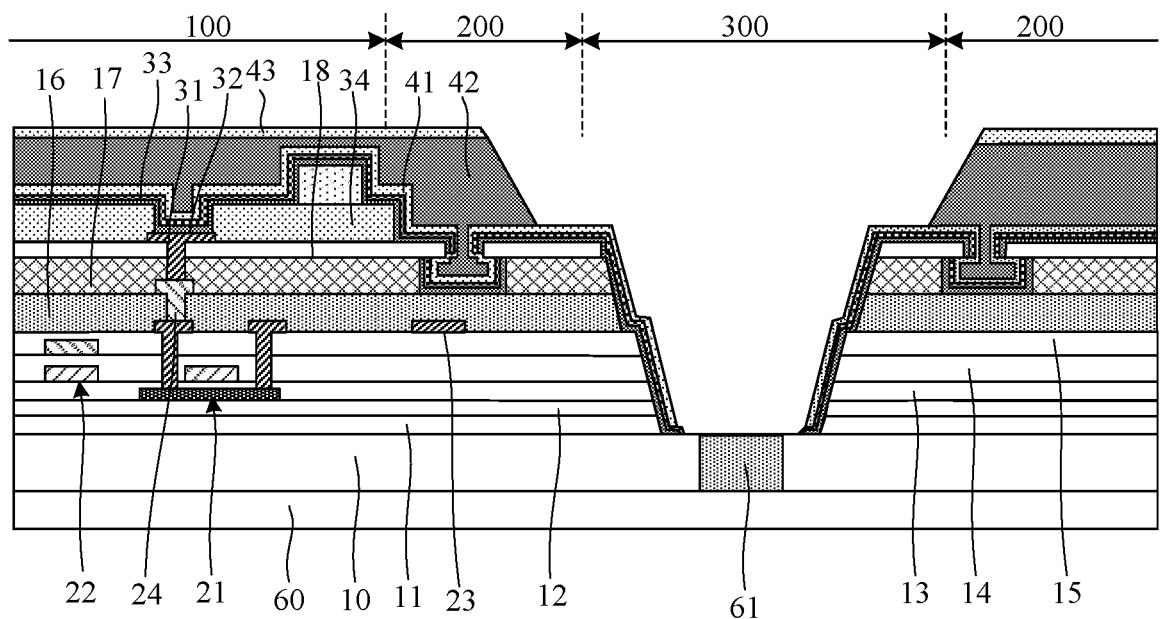

In some exemplary implementation modes, the first inorganic encapsulation layer 41, the cathode 33, and the organic emitting layer 32 are sequentially patterned through a patterning process in the hole region 300, the first inorganic encapsulation layer 41, the cathode 33, and the organic emitting layer 32 covering the first filling layer 61 and a part of the flexible base substrate 10 are removed to expose a surface of the first filling layer 61, as shown in FIG. 5J. In this example, the first filling layer 61 of the hole region 300 may not be covered by rest of a film layer structure so that a stretchable effect of the display substrate may be ensured.

(12) Forming a buffer protection layer 50.

Figure 5K:
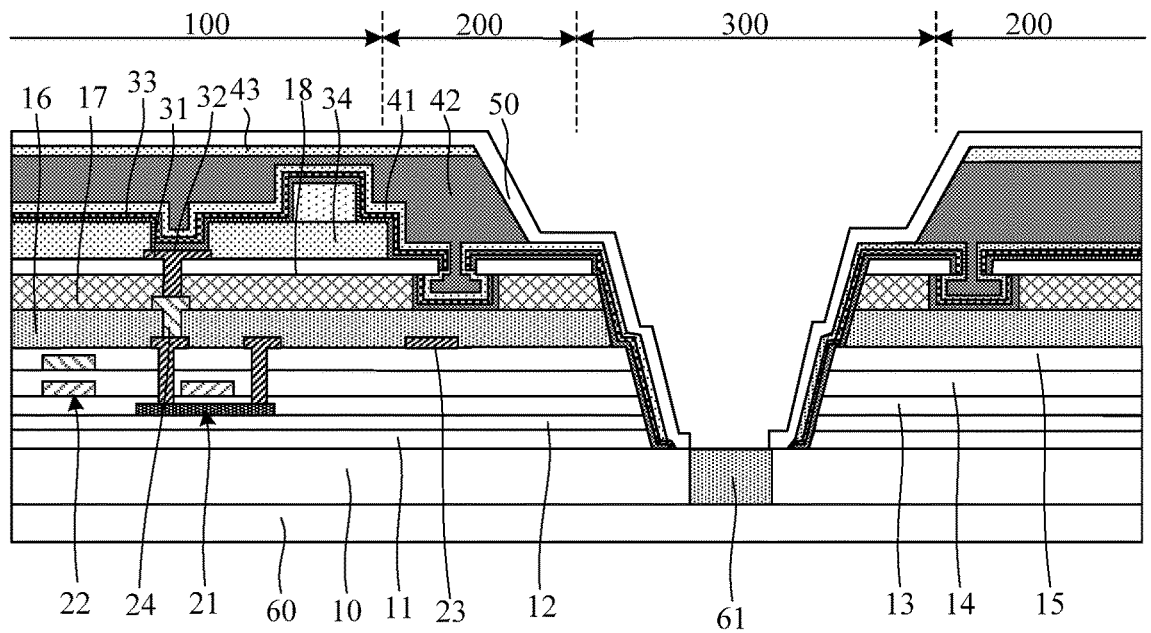

In some exemplary implementation modes, a buffer protection thin film is deposited on the flexible base substrate 10 on which the aforementioned patterns are formed, and the buffer protection thin film is patterned through a patterning process to form the buffer protection layer 50, as shown in FIG. 5K. The buffer protection layer 50 of the hole region 300 is etched away to expose a surface of the first filling layer 61. In this example, an orthographic projection of the buffer protection layer 50 on the flexible base substrate 10 may contain an orthographic projection of the first inorganic encapsulation layer 41 on the flexible base substrate 10 and is not overlapped with an orthographic projection of the first filling layer 61 on the flexible base substrate 10. In some examples, the buffer protection layer 50 may serve as a base substrate of a touch structure layer, and the touch structure layer may be disposed on the buffer protection layer 50.

In some examples, the flexible base substrate 10 may be peeled off from the glass substrate 60 through a Laser-Lift-Off (LTO) process after preparation of the display substrate is completed. In this example, the first filling layer 61 is filled in the first through hole of the flexible base substrate 10, so that the encapsulation layer 40 may be prevented from being in direct contact with the glass substrate 60, thereby avoiding tearing failure of the encapsulation layer 40 when the glass substrate 60 is peeled off.

A structure and the preparation process of the display substrate of this embodiment are merely illustrative. In some exemplary implementation modes, corresponding structures may be changed and patterning processes may be increased or decreased according to actual needs. For example, the second planarization layer and the fourth metal layer may be omitted, the anode of the light emitting element may be directly connected with the third metal layer, and the first isolation groove is formed in the passivation layer and the first planarization layer. The present disclosure is not limited herein.

In some exemplary implementation modes, a structure of the main display region of the display substrate may refer to a structure of the pixel island region of the stretch display region and therefore will not be repeated here.

In the exemplary implementation mode, by filling the first filling layer in the first through hole of the flexible base substrate 10, deep hole exposure residue in a subsequent process may be avoided. Moreover, when the flexible base substrate is separated from the glass substrate, encapsulation failure caused by tearing the encapsulation layer may be avoided, so that an encapsulation effect of the display substrate may be improved, and a yield of the display substrate may be improved.

Figure 6:
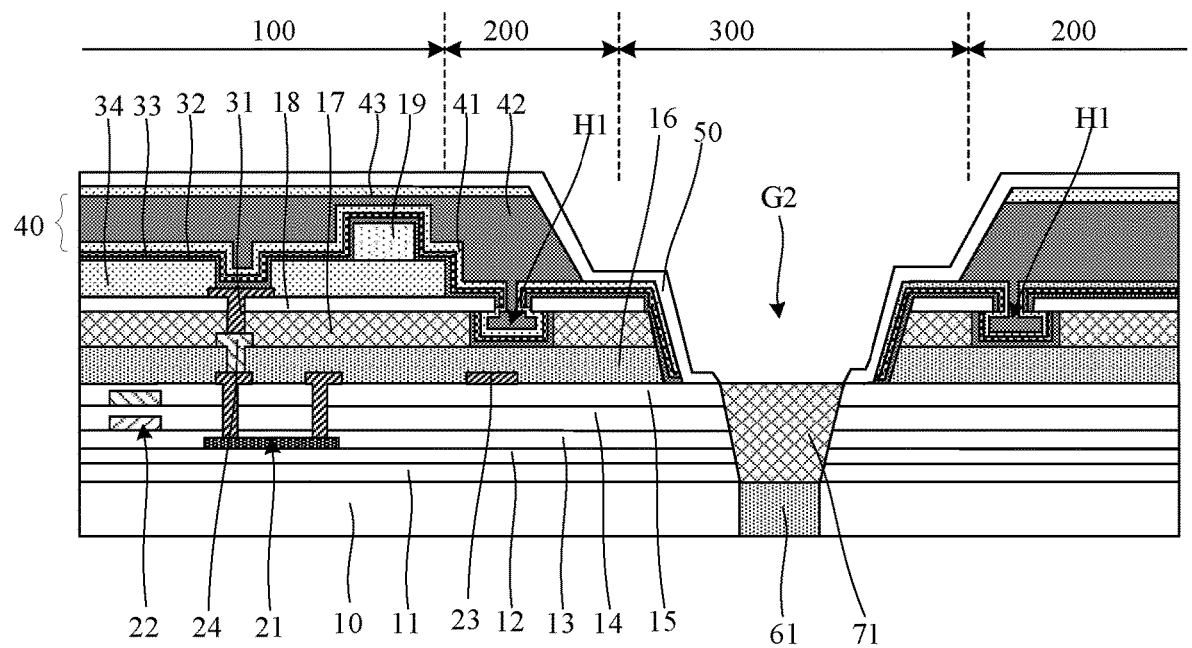
FIG. 6 is another schematic partial sectional view along a Q-Q' direction in FIG. 3.

FIG. 6 is another schematic partial sectional view along a Q-Q' direction in FIG. 3. In some exemplary implementation modes, as shown in FIG. 6, in a direction perpendicular to the display substrate, a pixel island region 100 may include a flexible base substrate 10, a drive structure layer, an emitting structure layer, an encapsulation layer 40, and a buffer protection layer 50 that are sequentially disposed on the flexible base substrate 10. In FIG. 6, only one light emitting element of the pixel island region 100, and one transistor and one capacitor of a pixel circuit are taken as an example for illustration. A connection bridge region 200 may include the flexible base substrate 10, an inorganic composite insulation layer provided on the flexible base substrate 10, a signal line provided on the inorganic composite insulation layer (only one signal line 23 is used for illustration in FIG. 6), a first planarization layer 16, a second planarization layer 17, a passivation layer 18, an encapsulation layer 40, and a buffer protection layer 50 that sequentially cover the signal line. Regarding structures of the pixel island region 100 and the connection bridge region 200, reference may be made to description of a previous embodiment and thus will not be repeated here.

In some exemplary implementation modes, as shown in FIG. 6, in a direction perpendicular to the display substrate, the flexible base substrate 10 of a hole region 300 has a first through hole that penetrates the flexible base substrate 10. A first filling layer 61 of the first planarization layer 16 is filled in the first through hole. An inorganic composite insulation layer of the hole region 300 has a second through hole which penetrates through the inorganic composite insulation layer. A second filling layer 71 is filled in the second through hole.

The second filling layer 71 is in direct contact with the first filling layer 61. An orthographic projection of the second filling layer 71 on the flexible base substrate 10 may cover an orthographic projection of the first filling layer 61 on the flexible base substrate 10. The hole region 300 has a second opening G2 that exposes the second filling layer 71. In this example, the first through hole and the second through hole are filled with the first filling layer 61 and the second filling layer 71 in the hole region 300, so that a deep hole exposure residue problem may be avoided.

In some exemplary implementation modes, as shown in FIG. 6, in the hole region 300, an orthographic projection of the encapsulation layer 40 on the flexible base substrate 10 may not be overlapped with an orthographic projection of the second filling layer 71 on the flexible base substrate 10, and may not be overlapped with an orthographic projection of the first filling layer 61 on the flexible base substrate 10, thereby ensuring a stretching effect of the display substrate. However, this embodiment is not limited thereto. For example, the orthographic projection of the encapsulation layer 40 on the flexible base substrate 10 may be partially overlapped with the orthographic projection of the second filling layer 71 on the flexible base substrate 10, and may not be overlapped with the orthographic projection of the first filling layer 61 on the flexible base substrate 10. Or, the orthographic projection of the encapsulation layer 40 on the flexible base substrate 10 may be partially overlapped with the orthographic projection of the second filling layer 71 on the flexible base substrate 10 and be also partially overlapped with the orthographic projection of the first filling layer 61 on the flexible base substrate 10.

In some exemplary implementation modes, in the preparation process of the display substrate, after the fourth metal layer is formed, a second planarization thin film made of an organic material may be coated on the flexible base substrate 10, the second planarization thin film is patterned through a patterning process, the second planarization layer 17 covering the fourth metal layer is formed in the pixel island region 100 and the connection bridge region 200, and the second filling layer 71 is formed in the hole region 300. The second planarization layer 17 is provided with a seventh via K27 in the hole region 300, the first planarization layer 16 is provided with a sixth via K26 in the hole region 300, and the seventh via K27 communicates with the sixth via K26. An orthographic projection of the seventh via K27 on the flexible base substrate 10 may contain an orthographic projection of the sixth via K26 on the flexible base substrate 10. The second filling layer 71 is filled in the second through hole of the hole region 300. A surface of the second filling layer 71 away from the flexible base substrate 10 may be flush with a surface of the fifth insulation layer 15 away from the flexible base substrate 10. However, this embodiment is not limited thereto. For example, the surface of the second filling layer 71 away from the flexible base substrate 10 may be lower than the surface of the fifth insulation layer 15 away from the flexible base substrate 10.

In the exemplary implementation mode, the sixth via of the first planarization layer 16, the seventh via of the second planarization layer 17, and an eighth via of the passivation layer 18 may communicate to form a second opening G2 of the display substrate. The organic emitting layer 32, the cathode 33, the first inorganic encapsulation layer 41, and the buffer protection layer 50 may cover a sidewall and a partial region of a bottom of the second opening G2 without being overlapped with the second filling layer 71, so as to avoid affecting a stretchable effect of the display substrate.

Regarding rest of the structure and the preparation process of this embodiment, reference may be made to description of a previous embodiment, and thus will not be repeated here.

The structure (or method) shown in this implementation mode may be combined with structures (or methods) shown in other implementation modes as appropriate.

Figure 7:
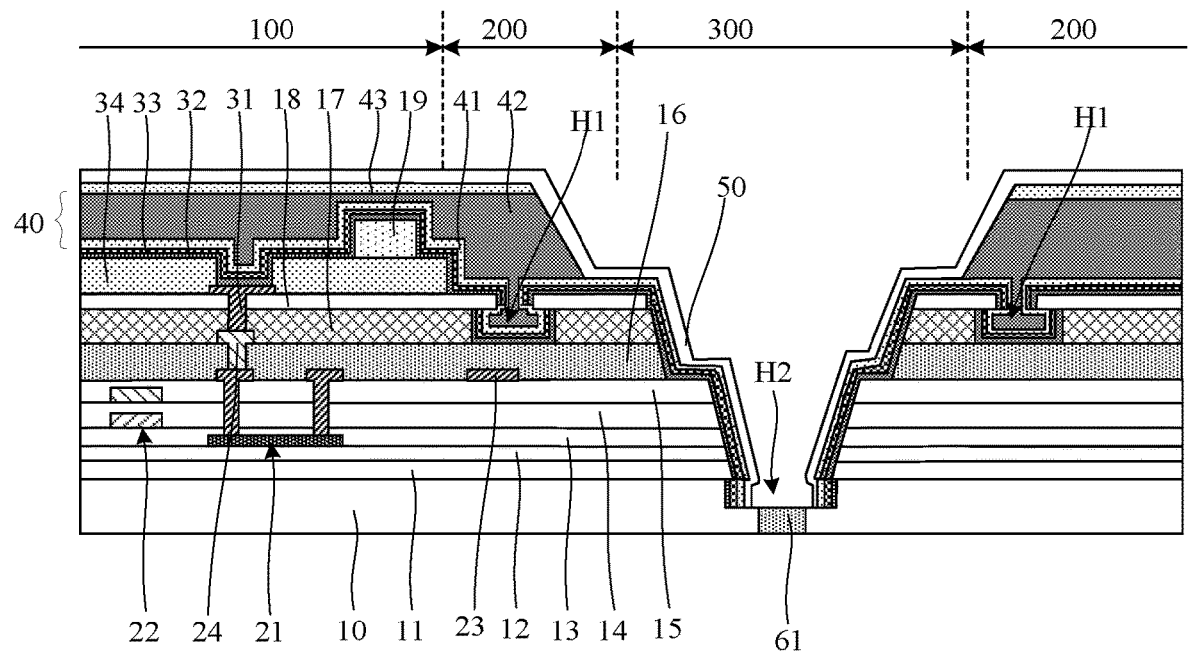
FIG. 7 is another schematic partial sectional view along a Q-Q' direction in FIG. 3.

FIG. 7 is another schematic partial sectional view along a Q-Q' direction in FIG. 3. In some exemplary implementation modes, as shown in FIG. 7, in a direction perpendicular to the display substrate, the hole region 300 is provided with a second isolation groove H2. The second isolation groove H2 is formed by penetrating an inorganic composite insulation layer, a part of the first filling layer 61, and a part of the flexible base substrate 10. The inorganic composite insulation layer includes a first insulation layer 11, a second insulation layer 12, a third insulation layer 13, a fourth insulation layer 14, and a fifth insulation layer 15 sequentially stacked on the flexible base substrate 10. The second isolation groove H2 penetrates through a second through hole of the inorganic composite insulation layer. At least one insulation layer of the inorganic composite insulation layer has a second protruding part. An orthographic projection of the second protruding part on the flexible base substrate 10 is located in an orthographic projection of the second isolation groove H2 on the flexible base substrate 10. The second protruding part of the inorganic composite insulation layer partially shields a notch of the second isolation groove H2 so that an orthographic projection of the notch of the second isolation groove H2 is located in the orthographic projection of the second isolation groove H2 on the flexible base substrate 10. The orthographic projection of the second isolation groove H2 on the flexible base substrate 10 may cover an orthographic projection of the first filling layer 61 on the flexible base substrate 10.

Regarding structures of the pixel island region 100 and connection bridge region 200 of the display substrate of this embodiment, reference may be made to descriptions of the aforementioned embodiments, and thus will not be repeated here.

Figure 8A:
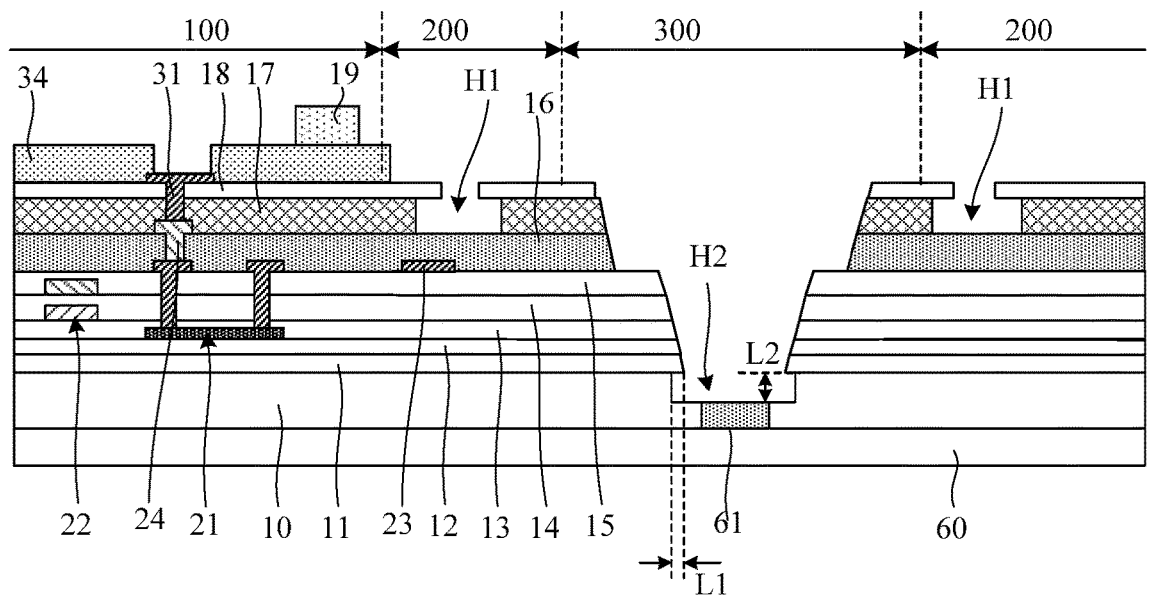
FIG. 8A to FIG. 8C are schematic diagrams of another preparation process of a display substrate according to at least one embodiment of the present disclosure.

A preparation process of the display substrate shown in FIG. 7 will be illustrated below by way of example in connection with the preparation process of a previous embodiment and FIG. 8A to FIG. 8C.

In some exemplary implementation modes, as shown in FIG. 5E, the first planarization layer 16 is formed in the pixel island region 100 and the connection bridge region 200, and the first filling layer 61 filling the first through hole of the flexible base substrate 10 is formed in the hole region 300. Subsequently, as shown in FIG. 8A, the fourth metal layer, the second planarization layer 17, the passivation layer 18, the anode layer, the pixel definition layer 34, and the post spacer 19 are formed sequentially.

Subsequently, a photoresist is coated on the passivation layer 18. The photoresist is exposed and developed to form an isolation hole penetrating the passivation layer 18, and then at least a part of the second planarization layer 17 is dry-etched using the passivation layer 18 with the isolation hole as a mask to form a first groove, and at least a part of the flexible base substrate 10 and the first filling layer 61 are dry-etched using the first insulation layer 11 with a first via as a mask to form a second groove. In this example, the isolation hole of the passivation layer 18 and the first groove of the second planarization layer 17 communicate to form a first isolation groove H1. A size of a notch of the first isolation groove H1 is determined by a size of the isolation hole of the passivation layer 18.

In some examples, the inorganic composite insulation layer has a second protruding part over the second groove, and an orthographic projection of the second protruding part of the inorganic composite insulation layer on the flexible base substrate 10 is located in an orthographic projection of the second groove on the flexible base substrate 10. The second protruding part of the inorganic composite insulation layer partially shields a notch of the second isolation groove H2 so that an orthographic projection of the notch of the second groove is located in an orthographic projection of the second isolation groove H2 on the flexible base substrate 10. In some examples, the second protruding part of the inorganic composite insulation layer may be formed by least one of the first insulation layer 11 to the fifth insulation layer 15 that are overlapped with the orthographic projection of the second groove on the flexible base substrate 10. In some examples, the second protruding part of the inorganic composite insulation layer may be formed by the first insulation layer 11, the second insulation layer 12, and the third insulation layer 13 that are overlapped with the orthographic projection of the second groove on the flexible base substrate 10. The first via of the first insulation layer 11 communicates with the second groove of the flexible base substrate 10. A size of the notch of the second isolation groove H2 is determined by a size of the first via of the first insulation layer 11. The orthographic projection of the second groove on the flexible base substrate 10 may contain an orthographic projection of the first via on the flexible base substrate 10. However, this embodiment is not limited thereto. For example, the size of the notch of the second isolation groove may be determined by a size of a via on the second insulation layer or the third insulation layer.

In some examples, a mixed gas ($CF_4$, $O_2$) of carbon tetrafluoride ($CF_4$) and oxygen ($O_2$) may be used as an etching gas, by adjusting a ratio of the two, lateral etching of the second planarization layer 17 may be achieved to form the first groove, and lateral etching of the first filling layer 61 and the flexible base substrate 10 may be achieved to form the second groove.

In some examples, a thickness of the flexible base substrate 10 may be about 6 μm to 10 μm, for example, about 6 μm or 8 μm. A depth L2 of the second isolation groove H2 (i.e., a distance between a surface of the first insulation layer 11 on a side close to the flexible base substrate 10 and a bottom surface of the second groove) may be about 1.5 μm to 2.0 μm, for example, about 1.5 μm or 1.8 μm. A distance L1 between a sidewall of the second protruding part of the inorganic composite insulation layer and a sidewall of the second isolation groove H2 on a same side (i.e., a distance between a notch edge of the second isolation groove H2 and a sidewall of the second isolation groove H1 on a same side of the notch edge) may be about 0.3 μm to 0.5 μm, for example, about 0.3 μm or 0.4 μm. In this example, L1 is a maximum distance between a hole wall of the first via of the first insulation layer 11 and a sidewall of the second groove on a same side. However, this embodiment is not limited thereto.

Figure 8B:
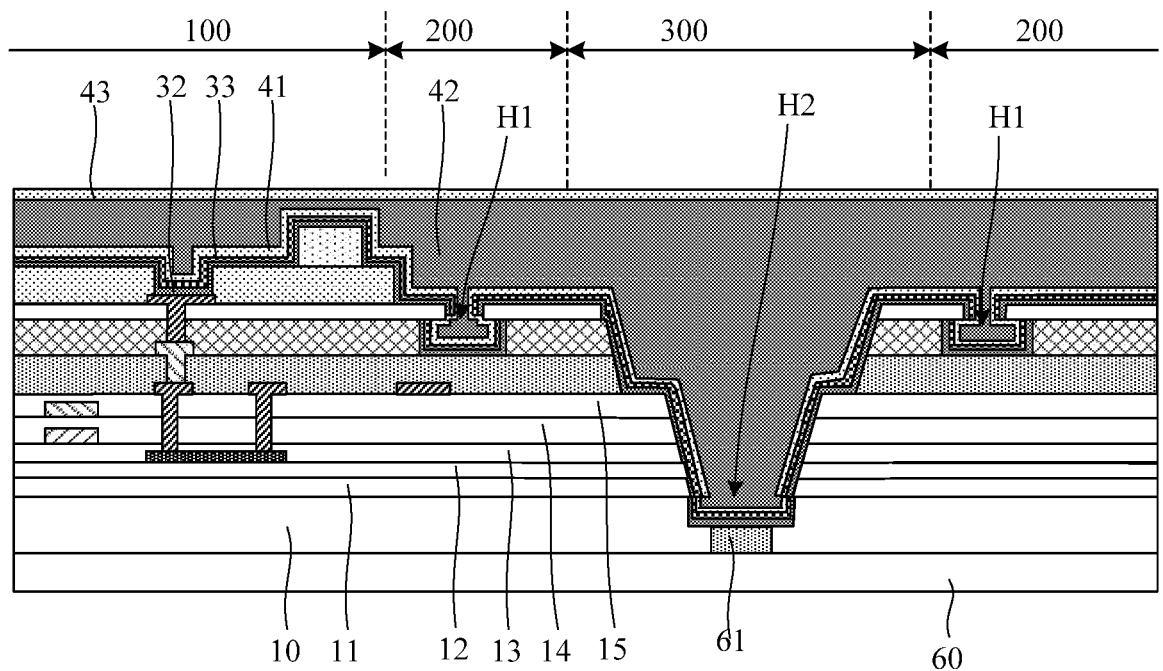

Subsequently, as shown in FIG. 8B, the organic emitting layer 32 and the cathode 33 are formed in the pixel island region 100, the connection bridge region 200, and the hole region 300 using an evaporation process. The organic emitting layer 32 and the cathode 33 are disconnected at the first isolation groove H1 and the second isolation groove H2. Subsequently, a first encapsulation thin film is deposited on the flexible base substrate 10 formed with the aforementioned patterns to form the first inorganic encapsulation layer 41 covering the entire flexible base substrate 10. Next, the organic encapsulation layer 42 is formed by using an inkjet printing process. Subsequently, a second encapsulation thin film is deposited to form the second inorganic encapsulation layer 43 covering the entire flexible base substrate 10. In this example, the first inorganic encapsulation layer 41 is cut off at the second isolation groove H2. However, this embodiment is not limited thereto.

Figure 8C:
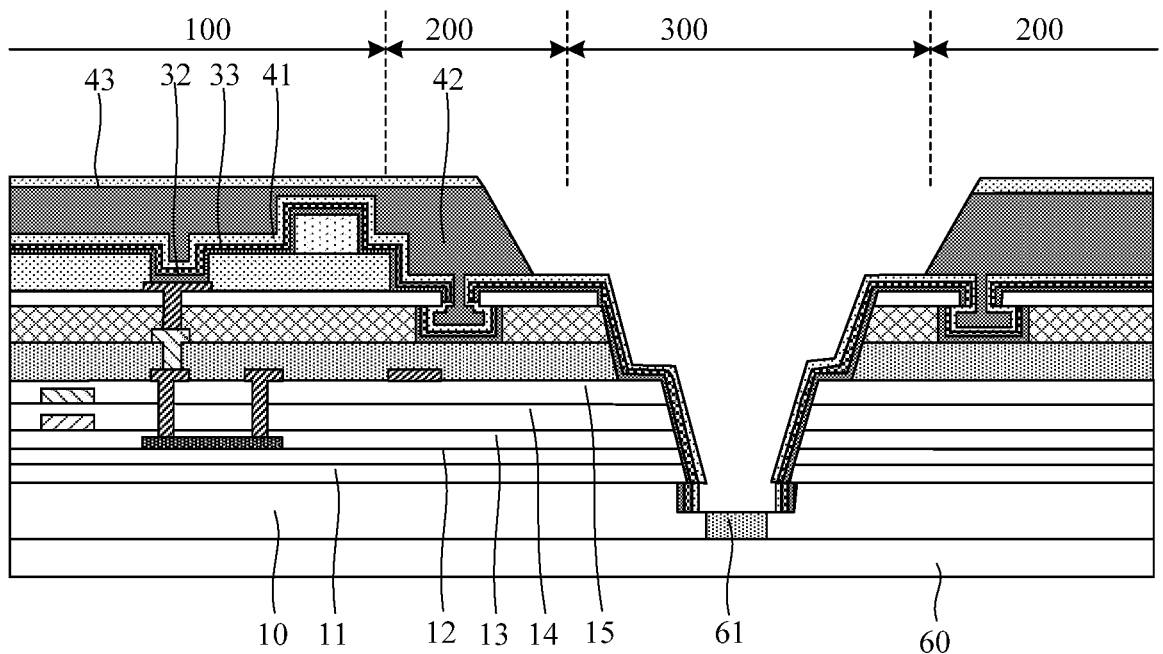

Subsequently, as shown in FIG. 8C, the organic encapsulation layer 42 and the second inorganic encapsulation layer 43 of the hole region 300 are etched to expose a surface of the first inorganic encapsulation layer 41 of the hole region 300. The organic emitting layer 32, the cathode 33, and the first inorganic encapsulation layer 41 are patterned in the hole region 300 to remove the flexible base substrate 10 in the second isolation groove H2, and the first inorganic encapsulation layer 41, the cathode 33, and the organic emitting layer 32 on the flexible base substrate 10 to expose a surface of the first filling layer 61 or expose surfaces of the first filling layer 61 and a part of the flexible base substrate 10. For example, the first inorganic encapsulation layer 41, the cathode 33, and the organic emitting layer 32 covering the flexible base substrate 10 and the first filling layer 61 at a bottom of the second isolation groove H2 are removed through an etching process, exposing the surface of the first filling layer 61 or exposing the surfaces of the first filling layer 61 and the part of the flexible base substrate 10. In this example, rest of a film layer structure is not covered on the first filling layer 61 so that a stretchable effect of the display substrate may be ensured. However, this embodiment is not limited thereto. For example, an edge part of the first filling layer 61 may be covered by the encapsulation layer 50 as long as the stretchable effect of the display substrate is ensured.

Subsequently, a buffer protection thin film is deposited on the flexible base substrate 10 on which the aforementioned patterns are formed, and the buffer protection thin film is patterned through a patterning process to form a buffer protection layer 50. The buffer protection layer 50 of the hole region 300 is etched away, exposing the surface of the first filling layer 61.

In the exemplary implementation mode, by filling the first filling layer 61 in the first through hole of the flexible base substrate 10 and forming the second isolation groove H2, when the flexible base substrate 10 is separated from the glass substrate 60, encapsulation failure caused by tearing the encapsulation layer may be avoided, so that an encapsulation effect of the display substrate may be improved. Moreover, by providing the second isolation groove H2, the organic emitting layer and the cathode may be cut off, and water vapor may be prevented from entering the light emitting element, thereby further improving the encapsulation effect of the display substrate.

Regarding rest of the structure and the preparation process of this embodiment, reference may be made to description of a previous embodiment, and thus will not be repeated here.

The structure (or method) shown in this implementation mode may be combined with structures (or methods) shown in other implementation modes as appropriate.

An embodiment of the present disclosure further provides a preparation method of a display substrate. The display substrate includes at least one stretch display region, the stretch display region includes multiple pixel island regions spaced apart from each other, multiple hole regions, and a connection bridge region located between a pixel island region and a hole region. The preparation method of the embodiment includes: forming one or more first through holes penetrating a flexible base substrate in the hole region;

forming a first filling layer for filling a first through hole in the hole region; and forming an encapsulation layer, wherein an orthographic projection of the encapsulation layer on the flexible base substrate is partially overlapped with or is not overlapped with the first filling layer.

In some exemplary implementation modes, the preparation method of the embodiment may further include: forming a first planarization layer in the pixel island region and the connection bridge region when the first filling layer is formed in the hole region.

In some exemplary implementation modes, the preparation method of the embodiment may further include: forming a composite insulation layer on the flexible base substrate before the first filling layer is formed in the hole region, and forming a second through hole in the composite insulation layer of the hole region, wherein the second through hole penetrates the composite insulation layer and penetrates through a corresponding first through hole.

In some exemplary implementation modes, the preparation method of the embodiment may further include: forming a second planarization layer in the pixel island region and the connection bridge region after the first filling layer is formed in the hole region, at the same time, forming a second filling layer in the hole region, wherein the second filling layer is filled in the second through hole. The second filling layer is in contact with the first filling layer, and an orthographic projection of the second filling layer on the flexible base substrate is at least partially overlapped with an orthographic projection of the first filling layer on the flexible base substrate. The orthographic projection of the encapsulation layer on the flexible base substrate is partially overlapped with or is not overlapped with the orthographic projection of the second filling layer on the flexible base substrate.

In some exemplary implementation modes, the preparation method of the embodiment may further include: forming a second isolation groove penetrating the composite insulation layer, a part of the second planarization part, and a part of the flexible base substrate in the hole region after the first filling layer is formed in the hole region. The second isolation groove penetrates through the second through hole of the composite insulation layer. At least one insulation layer in the composite insulation layer has a second protruding part, and an orthographic projection of the second protruding part on the flexible base substrate is located in an orthographic projection of the second isolation groove on the flexible base substrate. The orthographic projection of the second isolation groove on the flexible base substrate covers the orthographic projection of the first filling layer on the flexible base substrate.

Relevant description of the preparation method of this embodiment may refer to the descriptions in the aforementioned embodiments, and thus will not be repeated here.

At least one embodiment of the present disclosure further provides a display substrate, including a flexible base substrate. The flexible base substrate includes at least one stretch display region, the stretch display region includes multiple pixel island regions spaced apart from each other, multiple hole regions, and a connection bridge region located between a pixel island region and a hole region. At least one hole region is provided with one or more first through holes penetrating the flexible base substrate. The hole region further includes a composite insulation layer stacked on the flexible base substrate. The composite insulation layer has a second through hole. The second through hole penetrates the composite insulation layer and penetrates through a corresponding first through hole. An orthographic projection of the composite insulation layer on the flexible base substrate is overlapped with an orthographic projection of the first through hole on the flexible base substrate.

According to a display substrate provided by an exemplary implementation mode, by forming an undercut structure on a flexible base substrate or between a flexible base substrate and a composite insulation layer of a hole region, an adhesive force between an encapsulation layer of the hole region and a glass substrate is improved, thereby avoiding cracking failure of the encapsulation layer when the display substrate is peeled off from the glass substrate, and improving reliability of encapsulation of the display substrate.

In some exemplary implementation modes, the composite insulation layer includes a first insulation layer in contact with the flexible base substrate. The second through hole includes a first via provided in the first insulation layer. An orthographic projection of the first via on the flexible base substrate is located in an orthographic projection of the first through hole on the flexible base substrate. In this example, the encapsulation layer covers sidewalls of the first via and the first through hole. In this example, an undercut structure is formed using the flexible base substrate and the composite insulation layer of the hole region.

In some exemplary implementation modes, the first through hole may include a first sub-through hole and a second sub-through hole that communicate with each other, and the first sub-through hole penetrates through the second through hole. An orthographic projection of the first sub-through hole on the flexible base substrate is located in an orthographic projection of the second sub-through hole on the flexible base substrate. In this example, the encapsulation layer covers sidewalls of the first sub-through hole and the second through hole in the hole region. In this example, an undercut structure is formed using the first through hole of the flexible base substrate.

Solutions of the embodiment will be described below through some examples.

Figure 9:
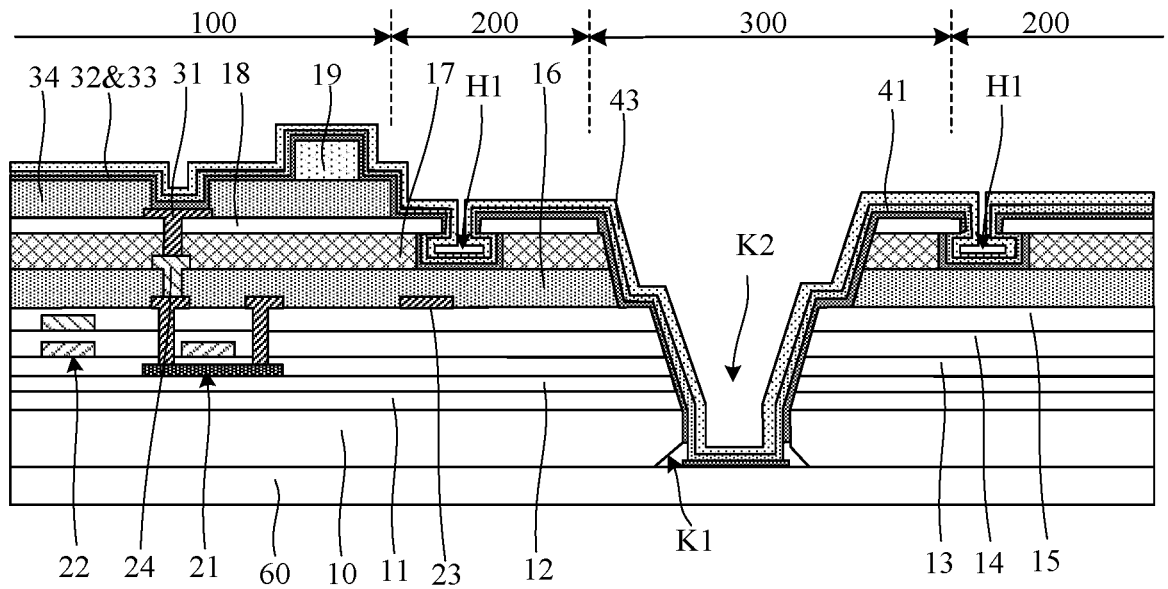
FIG. 9 is a schematic partial sectional view of a display substrate according to at least one embodiment of the present disclosure.
Figure 10:
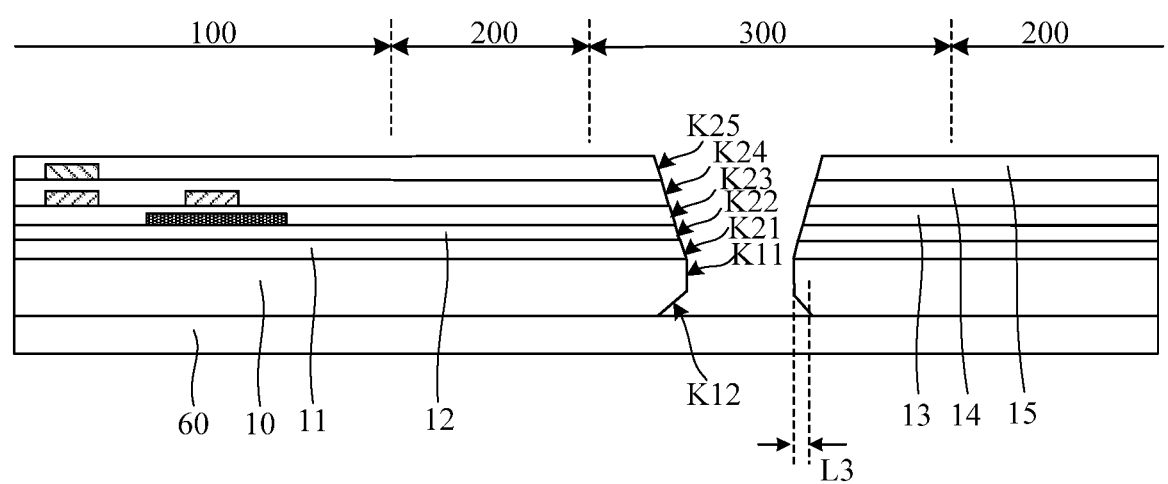
FIG. 10 is a schematic partial sectional view of a display substrate after a first through hole and a second through hole are formed according to at least one embodiment of the present disclosure.

FIG. 9 is a schematic partial sectional view of a display substrate according to at least one embodiment of the present disclosure. FIG. 10 is a schematic partial sectional view of a display substrate after a first through hole and a second through hole are formed according to at least one embodiment of the present disclosure.

In some exemplary implementation modes, as shown in FIG. 9 and FIG. 10, the flexible base substrate 10 of the hole region 300 has a first through hole K1 in a plane perpendicular to the display substrate. The first through hole K1 penetrates the flexible base substrate 10. In this example, the composite insulation layer is an inorganic composite insulation layer including multiple inorganic layers. The composite insulation layer has a second through hole K2 corresponding to the first through hole K1. The second through hole K2 penetrates the inorganic composite insulation layer and penetrates through the first through hole K1. The inorganic composite insulation layer includes a first insulation layer 11, a second insulation layer 12, a third insulation layer 13, a fourth insulation layer 14, and a fifth insulation layer 15 that are stacked on the flexible base substrate 10. The first insulation layer 11 is provided with a first via K21, the second insulation layer 12 is provided with a second via K22, the third insulation layer 13 is provided with a third via K23, the fourth insulation layer 14 is provided with a fourth via K24, and the fifth insulation layer 14 is provided with a fifth via K25. The first via K21 to the fifth via K25 communicate to form the second through hole K2. Sizes of the first via K21 to the fifth via K25 are sequentially increased. A cross-sectional shape of the second through hole K2 may be an inverted trapezoid.

In some exemplary implementation modes, as shown in FIG. 10, the first through hole K1 may include a first sub-through hole K11 and a second sub-through hole K12 that are communicated. The first sub-through hole K11 penetrates through the first via K21. An orthographic projection of the first sub-through hole K11 on the glass substrate 60 is located in an orthographic projection of the second sub-through hole K12 on the glass substrate 60. A size of the second sub-through hole K12 gradually increases along a side close to the glass substrate 60. For example, a cross-sectional shape of the second sub-through hole K12 may be a trapezoid and a cross-sectional shape of the first sub-through hole K11 may be a rectangle. However, this embodiment is not limited thereto.

In some exemplary implementation modes, as shown in FIG. 10, a maximum distance L3 between a sidewall of the first sub-through hole K11 and a sidewall of the second sub-through hole K12 on a same side may be greater than or equal to 0.3 μm, for example, may be about 0.3 μm or 0.5 μm. However, this embodiment is not limited thereto.

In some exemplary implementation modes, as shown in FIG. 9 and FIG. 10, an orthographic projection of the first insulation layer 11 of the inorganic composite insulation layer on the flexible base substrate 10 is overlapped with an orthographic projection of the second sub-through hole K12 on the flexible base substrate 10. In the hole region 300, an undercut structure is formed through the second sub-through hole K12 so that the organic emitting layer 32 and the cathode 33 are disconnected in the first through hole K1. The organic emitting layer 32 and the cathode 33 cover only the sidewall of the first sub-through hole K11 in the first through hole K1 and do not cover the sidewall of the second sub-through hole K12. The encapsulation layer includes a first inorganic encapsulation layer 41 and a second inorganic encapsulation layer 43 that are stacked. Both the first inorganic encapsulation layer 41 and the second inorganic encapsulation layer 43 cover a sidewall of the second through hole K2 and the sidewall of the first sub-through hole K11 and are not in contact with the sidewall of the second sub-through hole K12. In this example, the encapsulation layer is not completely attached to the glass substrate 60 so that cracking failure of the encapsulation layer may be avoided when the glass substrate 60 is peeled off.

Regarding rest of the structure and the preparation process of the display substrate of this embodiment, reference may be made to the descriptions of the aforementioned embodiments, and thus will not be repeated here.

The structure (or method) shown in this implementation mode may be combined with structures (or methods) shown in other implementation modes as appropriate.

Figure 11:
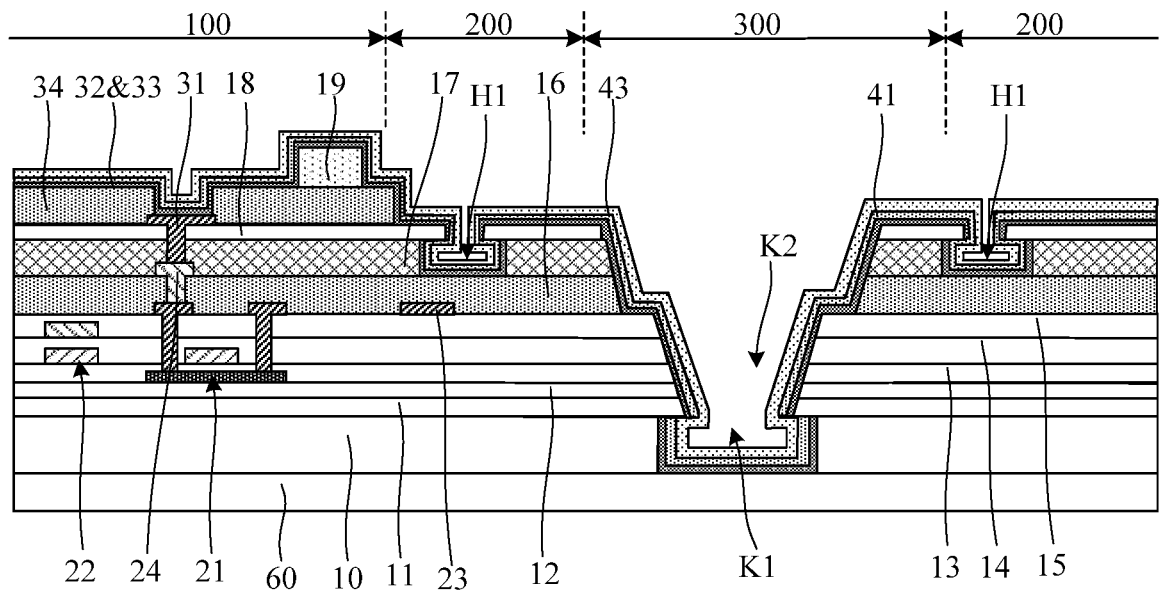
FIG. 11 is another schematic partial sectional view of a display substrate according to at least one embodiment of the present disclosure.
Figure 12:
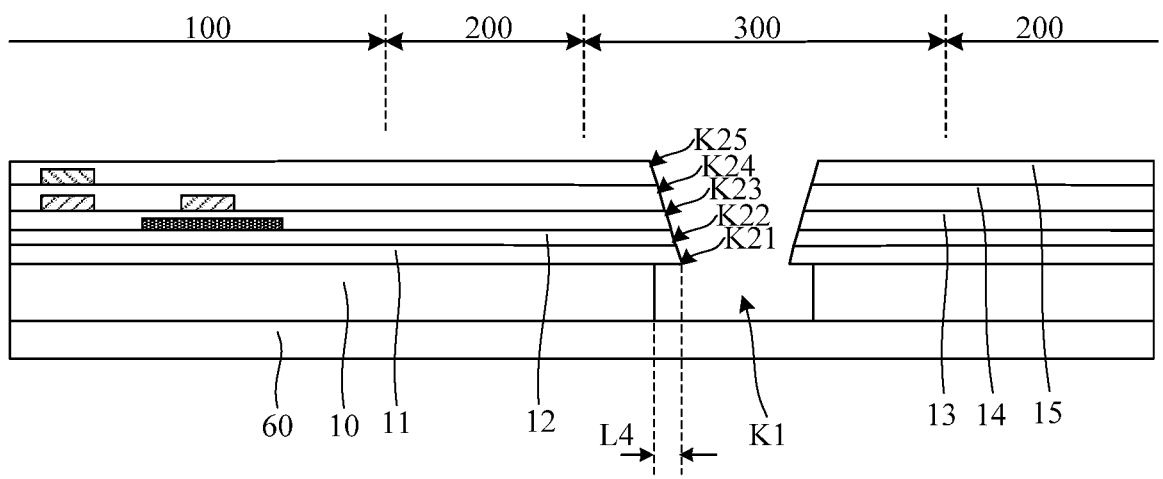
FIG. 12 is another schematic partial sectional view of a display substrate after a first through hole and a second through hole are formed according to at least one embodiment of the present disclosure.

FIG. 11 is another schematic partial sectional view of a display substrate according to at least one embodiment of the present disclosure. FIG. 12 is a schematic partial sectional view of a display substrate after a first through hole and a second through hole are formed according to at least one embodiment of the present disclosure.

In some exemplary implementation modes, as shown in FIG. 11 and FIG. 12, the flexible base substrate 10 of the hole region 300 has a first through hole K1 in a plane perpendicular to the display substrate. The first through hole K1 penetrates the flexible base substrate 10. In this example, the composite insulation layer is an inorganic composite insulation layer including multiple inorganic layers. The inorganic composite insulation layer has a second through hole K2 corresponding to the first through hole K1. The second through hole K2 penetrates the inorganic composite insulation layer and penetrates through the first through hole K1. The inorganic composite insulation layer includes a first insulation layer 11, a second insulation layer 12, a third insulation layer 13, a fourth insulation layer 14, and a fifth insulation layer 15 that are stacked on the flexible base substrate 10. The first insulation layer 11 is provided with a first via K21, the second insulation layer 12 is provided with a second via K22, the third insulation layer 13 is provided with a third via K23, the fourth insulation layer 14 is provided with a fourth via K24, and the fifth insulation layer 14 is provided with a fifth via K25. The first via K21 to the fifth via K25 communicate to form the second through hole K2. Sizes of the first via K21 to the fifth via K25 are sequentially increased. A cross-sectional shape of the second through hole K2 may be an inverted trapezoid. An orthographic projection of the first via K21 on the flexible base substrate 10 is located in an orthographic projection of the first through hole K1 on the flexible base substrate. A cross-sectional shape of the first through hole K1 may be a rectangle.

In some exemplary implementation modes, as shown in FIG. 12, a distance L4 between a sidewall of the first via K21 and a sidewall of the first through hole K1 on a same side may be greater than or equal to 0.3 μm, for example, about 0.3 μm or 0.4 μm. However, this embodiment is not limited thereto.

In some exemplary implementation modes, as shown in FIG. 11 and FIG. 12, in the hole region 300, an undercut structure is formed by setting a size of the first via K21 to be smaller than a size of the first through hole K1, so that the organic emitting layer 32 and the cathode 33 are disconnected in the first through hole K1. The encapsulation layer includes a first inorganic encapsulation layer 41 and a second inorganic encapsulation layer 43 that are stacked. The first inorganic encapsulation layer 41 may cover a sidewall of the second through hole K2 and a sidewall of the first through hole K1 and is disconnected at a junction of the first through hole K1 and the first via K21. The second inorganic encapsulation layer 43 may continuously cover the sidewall of the second through hole K2 and the sidewall of the first through hole K1. In this example, the first inorganic encapsulation layer is disconnected in the first through hole K1, so that encapsulation at the first through hole K1 is weak, and cracking failure of the encapsulation layer may be avoided when the flexible base substrate peels off from the glass substrate.

Regarding rest of the structure and the preparation process of the display substrate of this embodiment, reference may be made to the descriptions of the aforementioned embodiments, and thus will not be repeated here.

The structure (or method) shown in this implementation mode may be combined with structures (or methods) shown in other implementation modes as appropriate.

Figure 13:
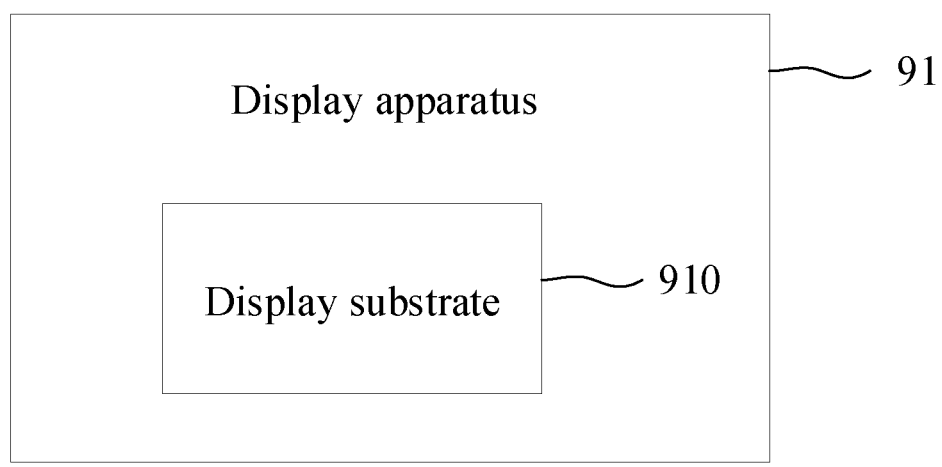
FIG. 13 is a schematic diagram of a display apparatus according to at least one embodiment of the present disclosure.

FIG. 13 is a schematic diagram of a display apparatus according to at least one embodiment of the present disclosure. As shown in FIG. 13, the embodiment provides a display apparatus 91, which includes a display substrate 910. The display substrate 910 is the display substrate provided in the aforementioned embodiments. In some examples, the display substrate 910 may be an OLED display substrate. The display apparatus 91 may be any product or component with a display function, such as an OLED display apparatus, a cell phone, a tablet computer, a television, a display, a laptop computer, a digital photo frame, a navigator, a vehicle-mounted display, a watch, and a wristband. However, this embodiment is not limited thereto.

In descriptions of the embodiments of the present disclosure, orientations or positional relationships indicated by terms "middle", "upper", "lower", "front", "back", "vertical", "horizontal", "top", "bottom", "inside", "outside", and the like are based on orientations or positional relationships shown in the drawings, and are only for convenience of describing the present disclosure and simplifying the description, but are not intended to indicate or imply that a referred apparatus or element must have a specific orientation, or be constructed and operated in a particular orientation, and therefore they should not be construed as limitations on the present disclosure.

Although the implementation modes disclosed in the present disclosure are as above, the described contents are only implementation modes used for convenience of understanding the present disclosure and are not intended to limit the present disclosure. Any person skilled in the art to which the present disclosure pertains may make any modification and variation in forms and details of implementation without departing from the spirit and scope disclosed in the present disclosure. However, the scope of patent protection of the present disclosure is still subject to the scope defined by the appended claims.

The invention claimed is:

1. A display substrate, comprising:
    a flexible base substrate comprising at least one stretch display region, wherein the stretch display region comprises multiple pixel island regions spaced apart from each other, multiple hole regions, and a connection bridge region located between a pixel island region and a hole region; wherein at least one hole region is provided with one or more first through holes penetrating the flexible base substrate;
    a first filling layer located in the hole region and filled in a first through hole; and
    an encapsulation layer located on a side of the first filling layer away from the flexible base substrate, wherein an orthographic projection of the encapsulation layer on the flexible base substrate is partially overlapped with or is not overlapped with the first filling layer.

2. The display substrate according to claim 1, further comprising: a first planarization layer located in the pixel island region and the connection bridge region, wherein the first planarization layer and the first filling layer have a same layer structure and a same material.

3. The display substrate according to claim 1, wherein the hole region further comprises a composite insulation layer stacked on the flexible base substrate, the composite insulation layer has a second through hole; the second through hole penetrates the composite insulation layer and penetrates through a corresponding first through hole;
    the composite insulation layer comprises at least one inorganic layer, or comprises at least one organic layer, or comprises at least one inorganic layer and at least one organic layer.

4. The display substrate according to claim 3, further comprising a second filling layer located in the hole region, wherein the second filling layer is filled in the second through hole;
    the second filling layer is in contact with the first filling layer, and an orthographic projection of the second filling layer on the flexible base substrate is at least partially overlapped with an orthographic projection of the first filling layer on the flexible base substrate; and the orthographic projection of the encapsulation layer on the flexible base substrate is partially overlapped with or is not overlapped with the orthographic projection of the second filling layer on the flexible base substrate.

5. The display substrate according to claim 4, further comprising a second planarization layer located in the pixel island region and the connection bridge region, wherein the second planarization layer is located on a side of the first planarization layer away from the flexible base substrate, and the second planarization layer and the second filling layer have a same layer structure and a same material.

6. The display substrate according to claim 2, wherein a surface of the first filling layer is flush with a surface of the flexible base substrate.

7. The display substrate according to claim 3, wherein the at least one hole region is provided with a second isolation groove formed on the flexible base substrate and the first filling layer, the second isolation groove penetrates through the second through hole of the composite insulation layer; at least one insulation layer in the composite insulation layer has a second protruding part, an orthographic projection of the second protruding part on the flexible base substrate is located in an orthographic projection of the second isolation groove on the flexible base substrate; and the orthographic projection of the second isolation groove on the flexible base substrate covers an orthographic projection of the first filling layer on the flexible base substrate.

8. The display substrate according to claim 2, further comprising: a second planarization layer located on a side of the first planarization layer away from the flexible base substrate, and a passivation layer located on a side of the second planarization layer away from the flexible base substrate;
    the connection bridge region is provided with a first isolation groove formed by penetrating the passivation layer and a part of the second planarization layer; the passivation layer has a first protruding part, and an orthographic projection of the first protruding part on the flexible base substrate is located in an orthographic projection of the first isolation groove on the flexible base substrate.

9. The display substrate according to claim 1, wherein the encapsulation layer comprises a first inorganic encapsulation layer, an organic encapsulation layer, and a second inorganic encapsulation layer that are stacked.

10. A display apparatus, comprising the display substrate according to claim 1.

11. A preparation method of a display substrate, the display substrate comprises at least one stretch display region, the stretch display region comprises multiple pixel island regions spaced apart from each other, multiple hole regions, and a connection bridge region located between a pixel island region and a hole region;
    the preparation method comprises:
    forming one or more first through holes penetrating a flexible base substrate in the hole region;
    forming a first filling layer for filling a first through hole in the hole region; and
    forming an encapsulation layer, wherein an orthographic projection of the encapsulation layer on the flexible base substrate is partially overlapped with or is not overlapped with the first filling layer.

12. The preparation method according to claim 11, further comprising: forming a first planarization layer in the pixel island region and the connection bridge region while forming the first filling layer in the hole region.

13. The preparation method according to claim 11, further comprising: forming a composite insulation layer on the flexible base substrate before the first filling layer is formed in the hole region, and forming a second through hole in the composite insulation layer of the hole region, wherein the second through hole penetrates the composite insulation layer and penetrates through a corresponding first through hole.

14. The preparation method according to claim 13, further comprising: forming a second planarization layer in the pixel island region and the connection bridge region after the first filling layer is formed in the hole region, at the same time, forming a second filling layer in the hole region, wherein the second filling layer is filled in the second through hole;

wherein the second filling layer is in contact with the first filling layer, and an orthographic projection of the second filling layer on the flexible base substrate is at least partially overlapped with an orthographic projection of the first filling layer on the flexible base substrate, and the orthographic projection of the encapsulation layer on the flexible base substrate is partially overlapped with or is not overlapped with the orthographic projection of the second filling layer on the flexible base substrate.

15. The preparation method according to claim 13, further comprising: after the first filling layer is formed in the hole region, forming a second isolation groove penetrating the composite insulation layer, a part of the second planarization part, and a part of the flexible base substrate, in the hole region; wherein the second isolation groove penetrates through the second through hole of the composite insulation layer; at least one insulation layer in the composite insulation layer has a second protruding part, an orthographic projection of the second protruding part on the flexible base substrate is located in an orthographic projection of the second isolation groove on the flexible base substrate; and the orthographic projection of the second isolation groove on the flexible base substrate covers an orthographic projection of the first filling layer on the flexible base substrate.

16. A display substrate, comprising:

a flexible base substrate comprising at least one stretch display region, wherein the stretch display region comprises multiple pixel island regions spaced apart from each other, multiple hole regions, and a connection bridge region located between a pixel island region and a hole region; at least one hole region is provided with one or more first through holes penetrating the flexible base substrate;

the hole region further comprises a composite insulation layer stacked on the flexible base substrate; the composite insulation layer has a second through hole; the second through hole penetrates the composite insulation layer and penetrates through a corresponding first through hole; and an orthographic projection of the composite insulation layer on the flexible base substrate is overlapped with an orthographic projection of a first through hole on the flexible base substrate.

17. The display substrate according to claim 16, wherein the composite insulation layer comprises a first insulation layer in contact with the flexible base substrate, and the second through hole comprises a first via provided in the first insulation layer;

an orthographic projection of the first via on the flexible base substrate is located in the orthographic projection of the first through hole on the flexible base substrate.

18. The display substrate according to claim 17, further comprising an encapsulation layer located on a side of the composite insulation layer away from the flexible base substrate, wherein the encapsulation layer covers sidewalls of the first through hole and the second through hole in the hole region.

19. The display substrate according to claim 16, wherein the first through hole comprises a first sub-through hole and a second sub-through hole that communicate with each other, the first sub-through hole penetrates through the second through hole;

an orthographic projection of the first sub-through hole on the flexible base substrate is located in an orthographic projection of the second sub-through hole on the flexible base substrate.

20. The display substrate according to claim 19, further comprising an encapsulation layer located on a side of the composite insulation layer away from the flexible base substrate, wherein the encapsulation layer covers sidewalls of the first sub-through hole and the second through hole in the hole region.

* * * * *